United States Patent
Yang et al.

(10) Patent No.: US 9,466,794 B2
(45) Date of Patent: Oct. 11, 2016

(54) LOW FORM VOLTAGE RESISTIVE RANDOM ACCESS MEMORY (RRAM)

(71) Applicant: Taiwan Semiconductor Manufacturing Company, Ltd., Hsin-Chu (TW)

(72) Inventors: Chin-Chieh Yang, Taipei (TW); Wen-Ting Chu, Kaohsiung (TW); Yu-Wen Liao, New Taipei (TW); Chih-Yang Chang, Yuanlin Township (TW); Hsia-Wei Chen, Taipei (TW); Kuo-Chi Tu, Hsin-Chu (TW); Ching-Pei Hsieh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/987,621

(22) Filed: Jan. 4, 2016

(65) Prior Publication Data

US 2016/0118584 A1 Apr. 28, 2016

Related U.S. Application Data

(62) Division of application No. 13/802,078, filed on Mar. 13, 2013, now Pat. No. 9,231,205.

(51) Int. Cl.
*H01L 21/20* (2006.01)
*H01L 21/311* (2006.01)
*H01L 45/00* (2006.01)
*H01L 27/24* (2006.01)

(52) U.S. Cl.
CPC ........ *H01L 45/1608* (2013.01); *H01L 27/2436* (2013.01); *H01L 27/2463* (2013.01); *H01L 45/04* (2013.01); *H01L 45/1233* (2013.01); *H01L 45/1253* (2013.01); *H01L 45/1273* (2013.01); *H01L 45/146* (2013.01); *H01L 45/16* (2013.01); *H01L 45/1675* (2013.01)

(58) Field of Classification Search
CPC ........ H01L 47/00; H01L 21/20; H01L 27/24
USPC ................... 257/3, 4, 255, E25.002, E21.52; 438/381, 382, 102, 694
See application file for complete search history.

(56) References Cited

U.S. PATENT DOCUMENTS

| | | | | |
|---|---|---|---|---|
| 6,737,728 B1 * | 5/2004 | Block | ................ | H01L 23/5223 257/296 |
| 6,849,891 B1 * | 2/2005 | Hsu | .................... | G11C 13/0007 257/192 |
| 6,937,457 B2 * | 8/2005 | Shih | .................... | H01L 27/0251 361/302 |

(Continued)

FOREIGN PATENT DOCUMENTS

CN 1813360 A 8/2006

*Primary Examiner* — Yuanda Zhang
*Assistant Examiner* — Sheikh Maruf
(74) *Attorney, Agent, or Firm* — Slater Matsil, LLP

(57) ABSTRACT

The present disclosure provides a resistive random access memory (RRAM) cells and methods of making the same. The RRAM cell includes a transistor and an RRAM structure. The RRAM structure includes a bottom electrode having a via portion and a non-planar portion, a resistive material layer conformally covering the non-planar portion of the bottom electrode; and, a top electrode on the resistive material layer. The via portion of the bottom electrode is embedded in a first RRAM stop layer. The non-planar portion of the bottom electrode has an apex and is centered above the via portion.

20 Claims, 18 Drawing Sheets

(56) References Cited

U.S. PATENT DOCUMENTS

| | | | |
|---|---|---|---|
| 2001/0049189 A1* | 12/2001 | Zahorik | H01L 21/76816 438/638 |
| 2003/0207570 A1* | 11/2003 | Perner | G11C 17/16 438/689 |
| 2006/0097238 A1* | 5/2006 | Breuil | G11C 13/0011 257/4 |
| 2008/0149733 A1* | 6/2008 | Yukawa | G11C 17/146 235/492 |
| 2009/0257271 A1* | 10/2009 | Noshiro | H01L 27/101 365/148 |
| 2011/0147694 A1* | 6/2011 | Song | H01L 27/101 257/3 |
| 2012/0305878 A1* | 12/2012 | Miller | H01L 45/085 257/4 |
| 2013/0170291 A1* | 7/2013 | Liu | G11C 13/0004 365/163 |

* cited by examiner

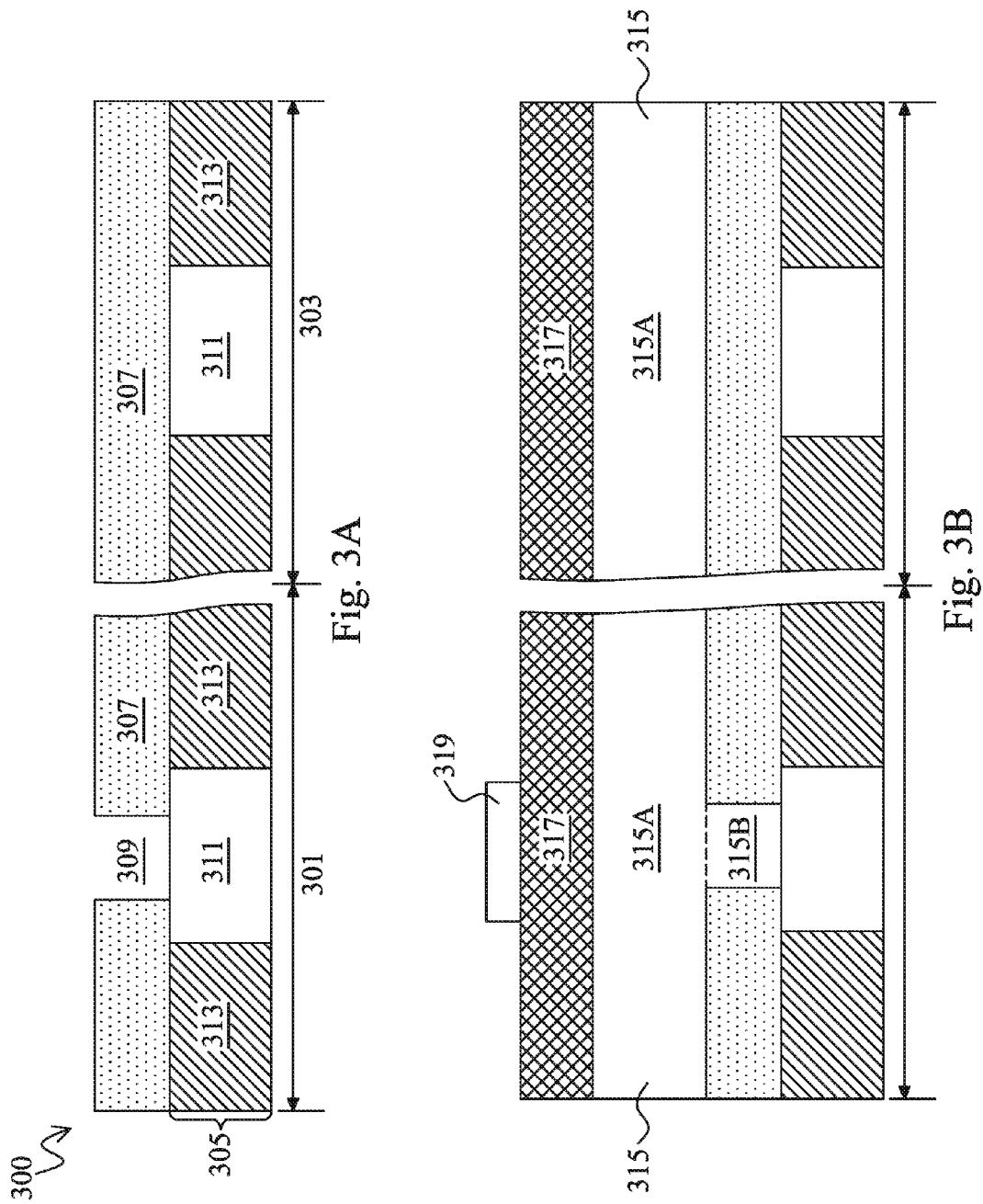

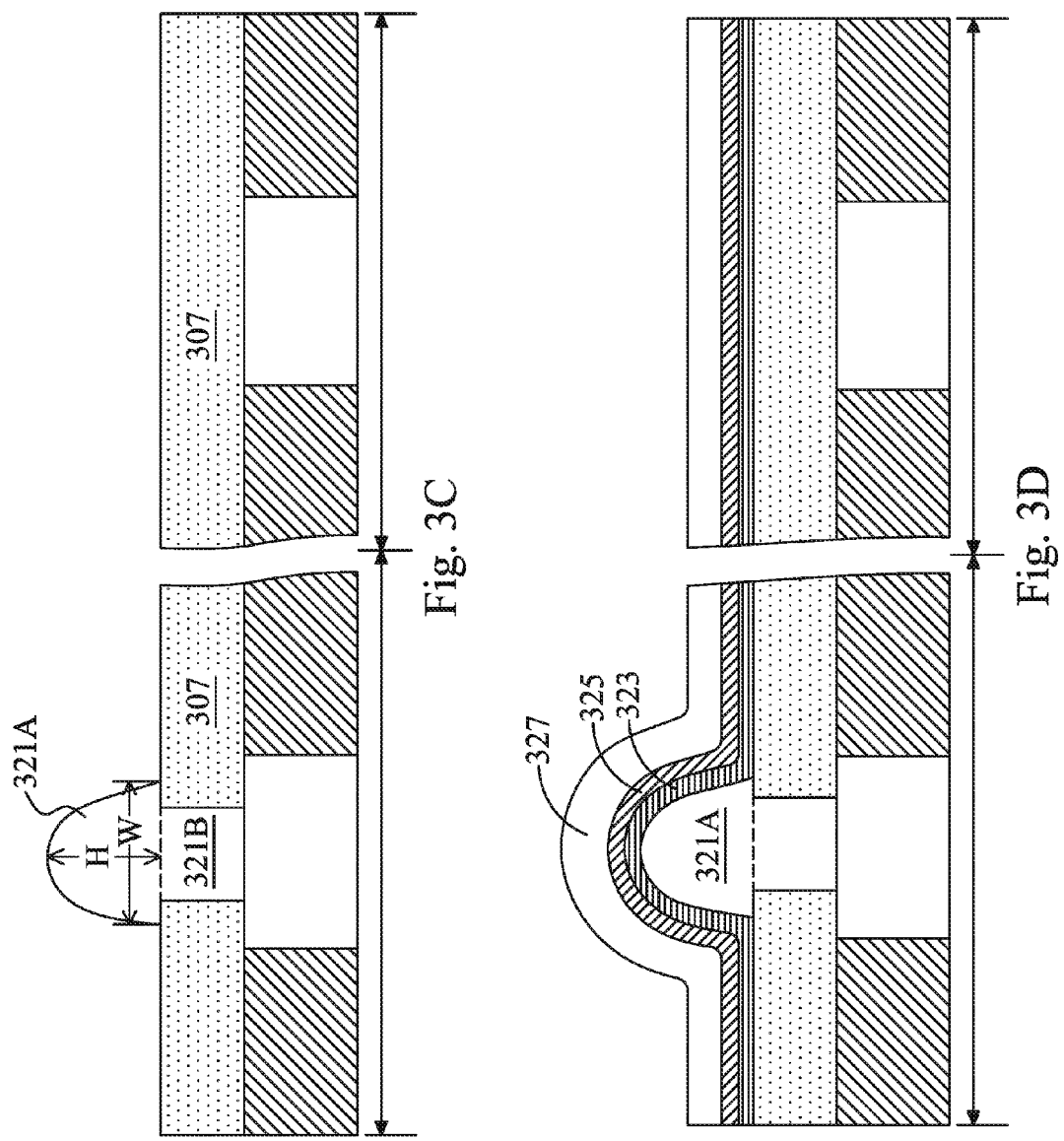

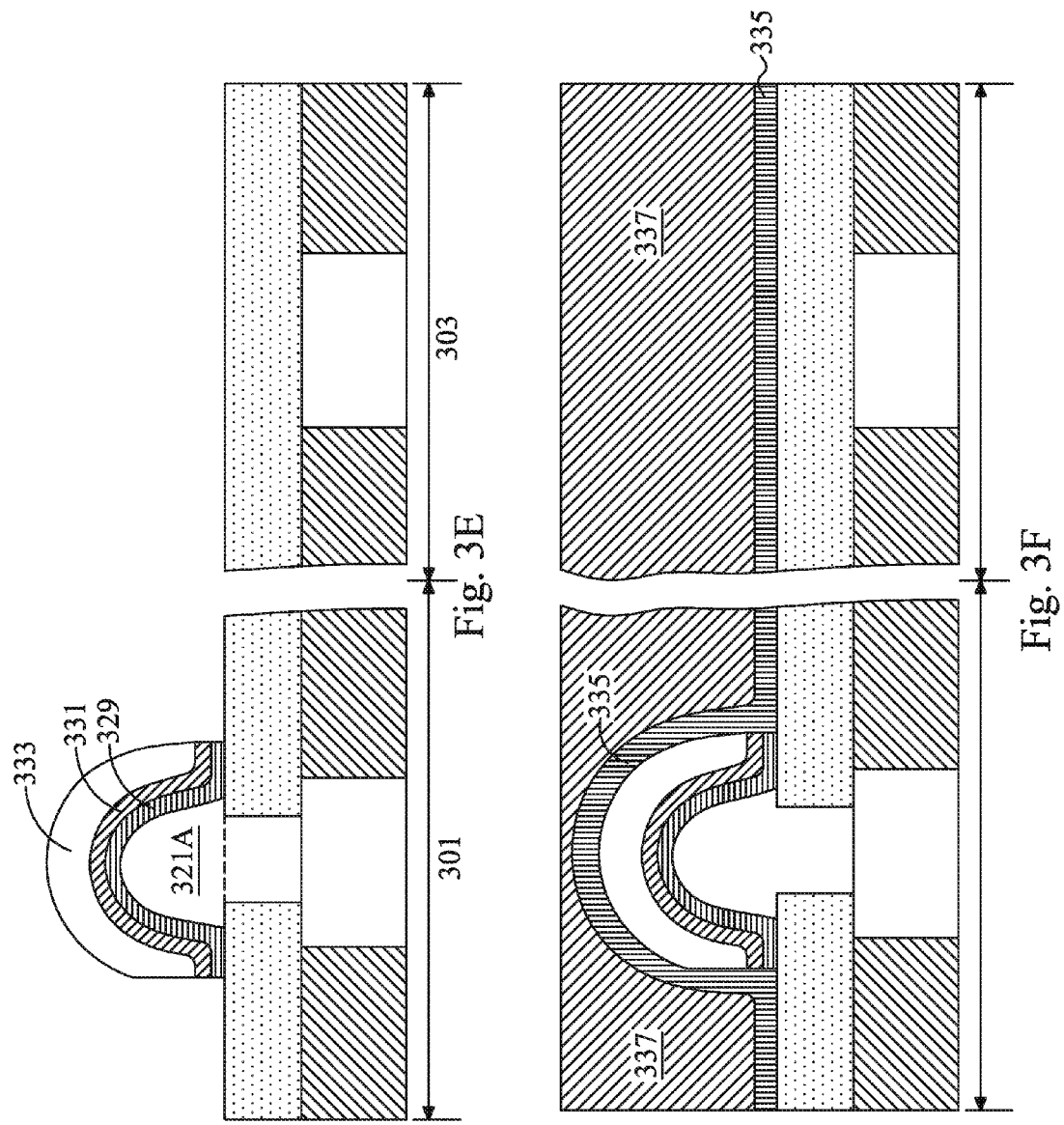

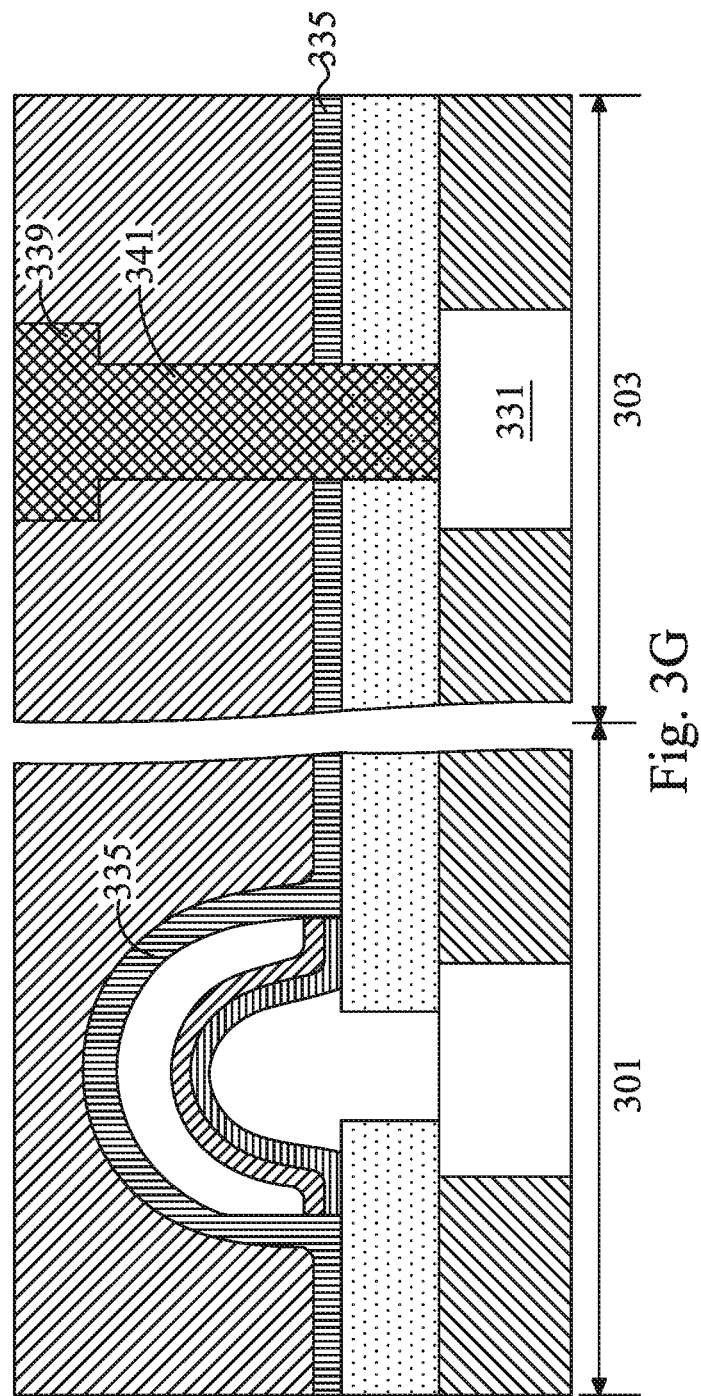

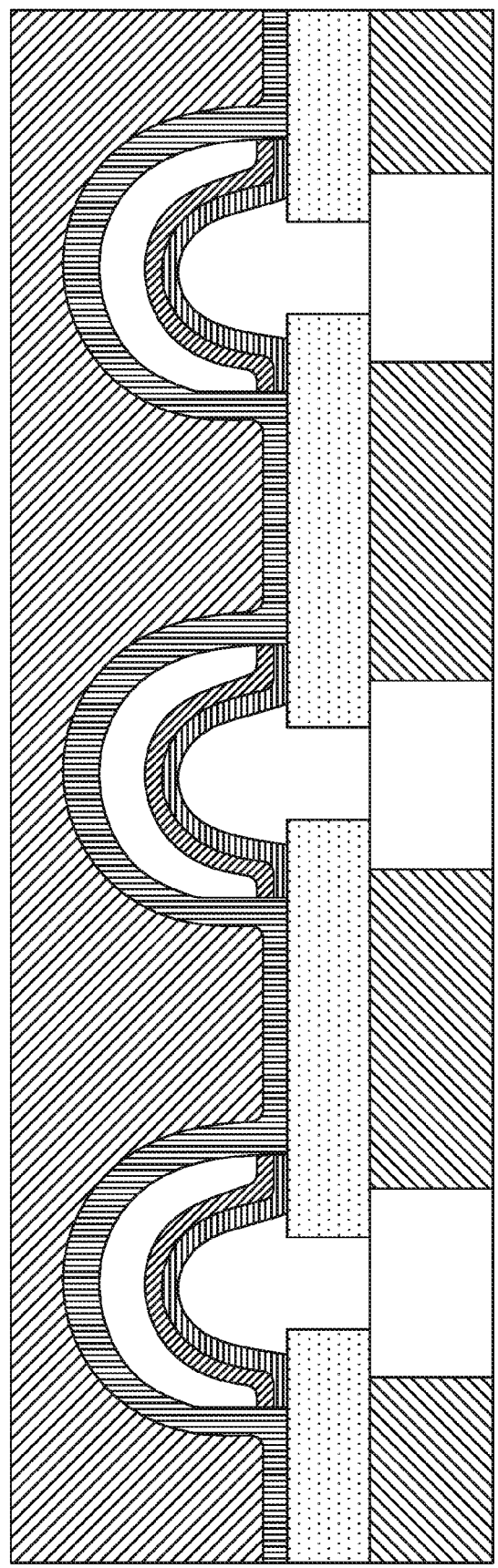
Fig. 4B   View A-A'

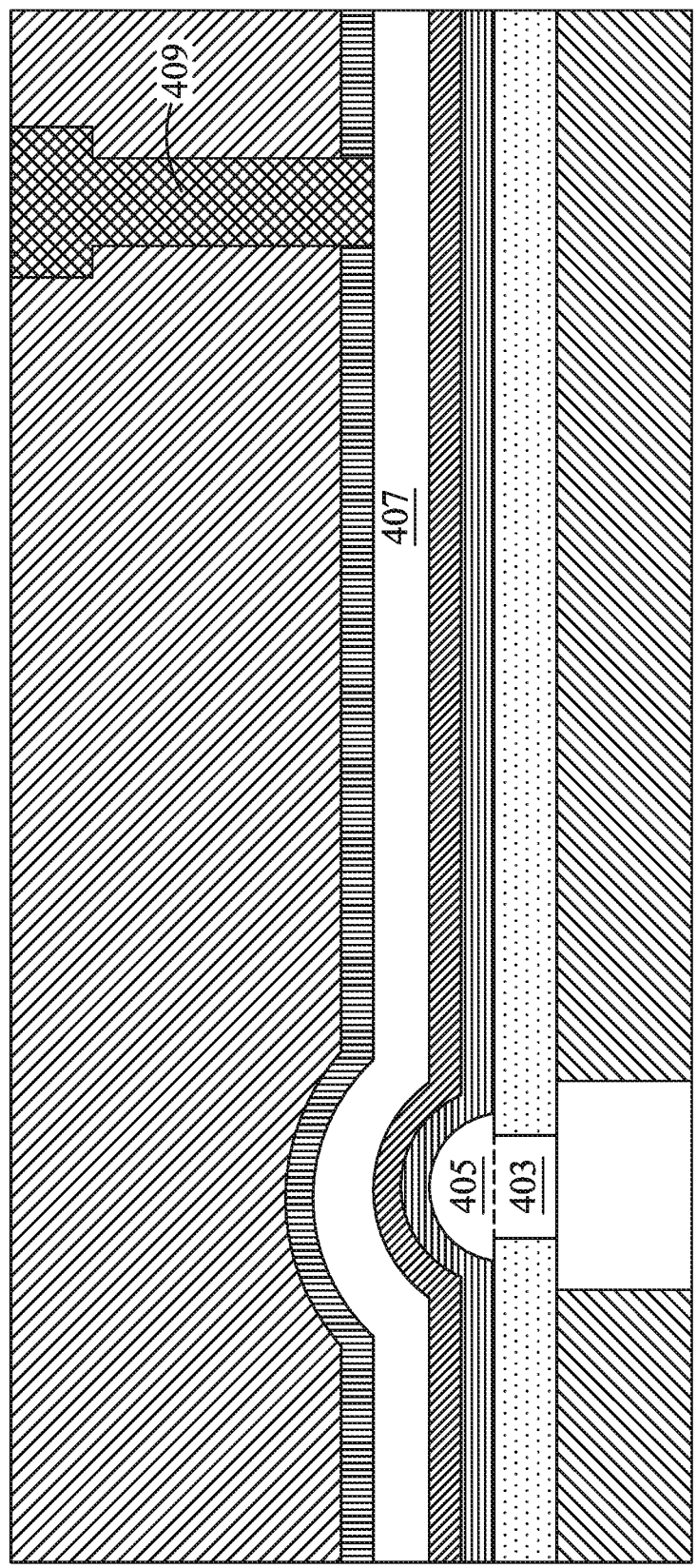
Fig. 4C   View B-B'

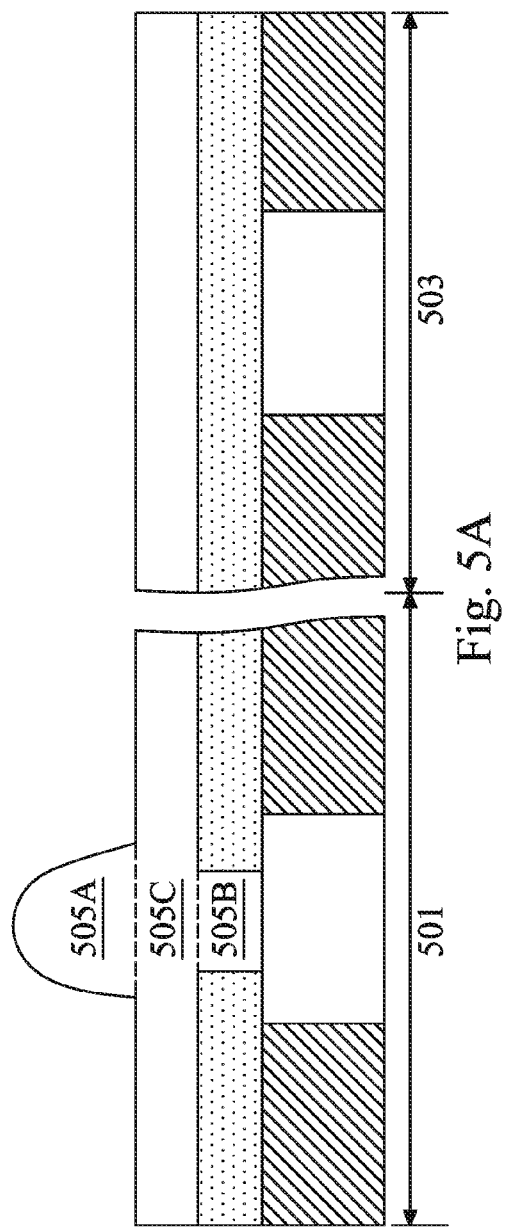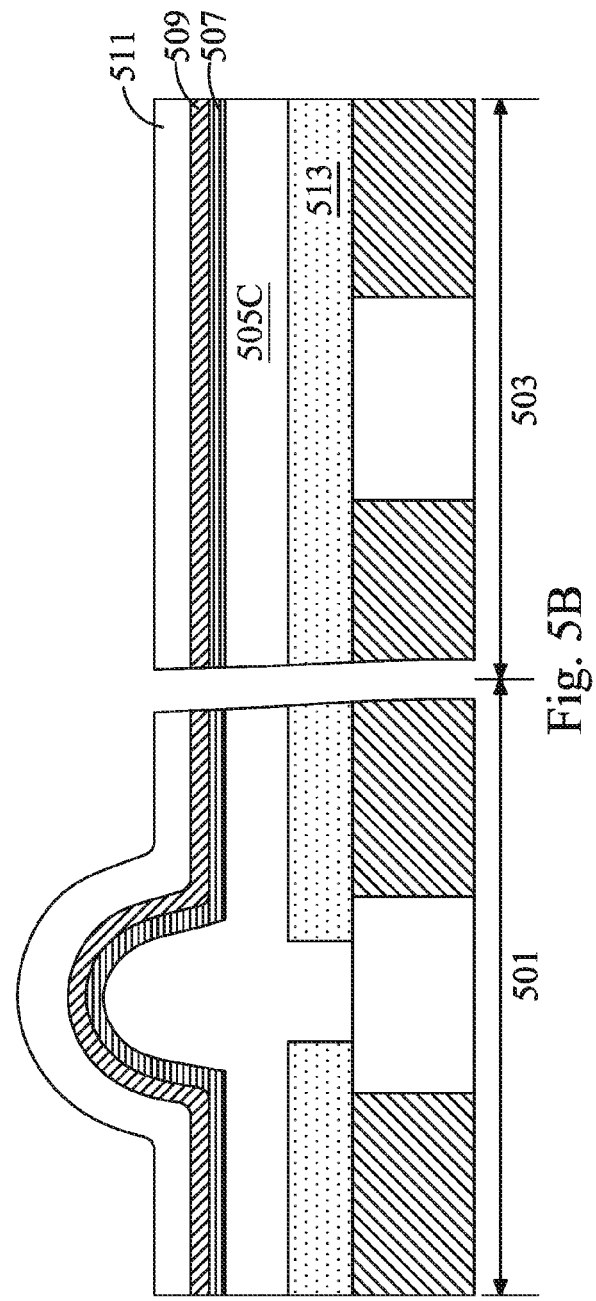

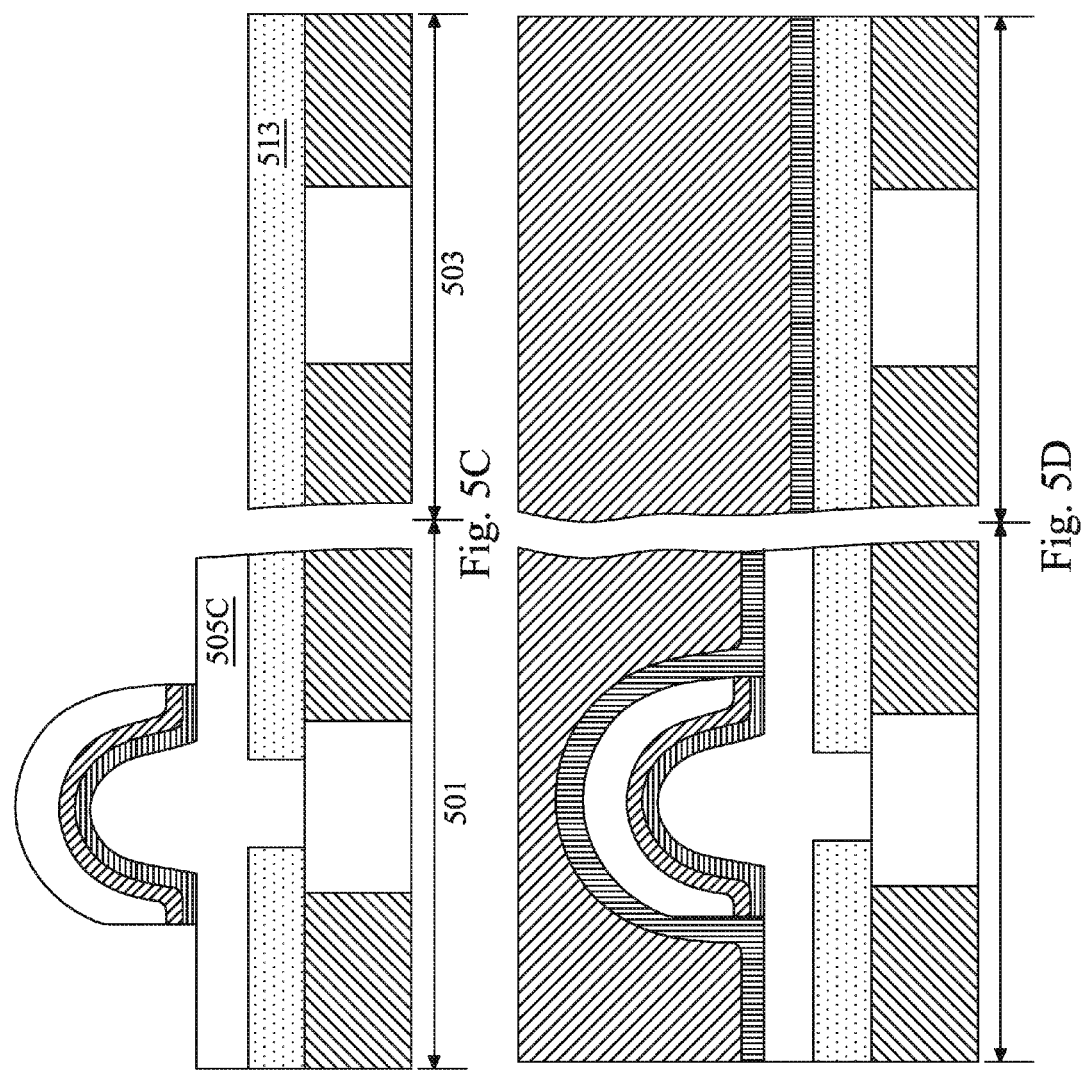

View A-A' or View C-C'

View B-B'

LOW FORM VOLTAGE RESISTIVE RANDOM ACCESS MEMORY (RRAM)

PRIORITY CLAIM AND CROSS-REFERENCE

This application claims the benefit to and is a divisional of U.S. patent application Ser. No. 13/802,078, filed on Mar. 13, 2013, and entitled "Low Form Voltage Resistive Random Access Memory (RRAM)" which application is incorporated herein by reference.

TECHNICAL FIELD

The disclosure relates to semiconductor devices and, more particularly, to resistive random-access memory (RRAM) device structures and layouts and methods for making the RRAM devices.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1." RRAM devices operate under the principle that a dielectric, which is normally insulating, can be made to conduct through a filament or conduction path formed after the application of a sufficiently high voltage. The forming of a filament or conduction path is the forming operation or forming process of the RRAM. The sufficiently high voltage is the 'form' voltage. The conduction path formation can arise from different mechanisms, including defect, metal migration, and other mechanisms. Various different dielectric materials may be used in RRAM devices. Once the filament or conduction path is formed, it may be "reset", i.e. broken, resulting in high resistance or "set", i.e. re-formed, resulting in lower resistance, by an appropriately applied voltage. There are various architectures to configure an array of RRAM cells. For example, a cross-point architecture includes a RRAM in each cell configured between a crossed word line and bit line. Recently, a transistor type architecture that pairs a RRAM with a transistor (1T1R) in each cell has been proposed that can improve random access time. However, initial proposals result in an inefficient device with significant leakage current. Thus, improvements in 1T1R RRAM cell and method of manufacturing continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3G are cross sectional diagrams of a partially fabricated RRAM structure in various stages of fabrication in accordance with the method embodiments of FIG. 2A of the present disclosure.

FIGS. 4B and 4C are cross sectional diagrams from cut lines in FIG. 4A in accordance with various embodiments of the cross sectional diagrams of FIGS. 3A-3G and the method embodiments of FIG. 2A.

FIGS. 5A-5E are cross sectional diagrams of a partially fabricated RRAM structure in various stages of fabrication in accordance with the method embodiments of FIG. 2B of the present disclosure.

DETAILED DESCRIPTION

Figure 1A:
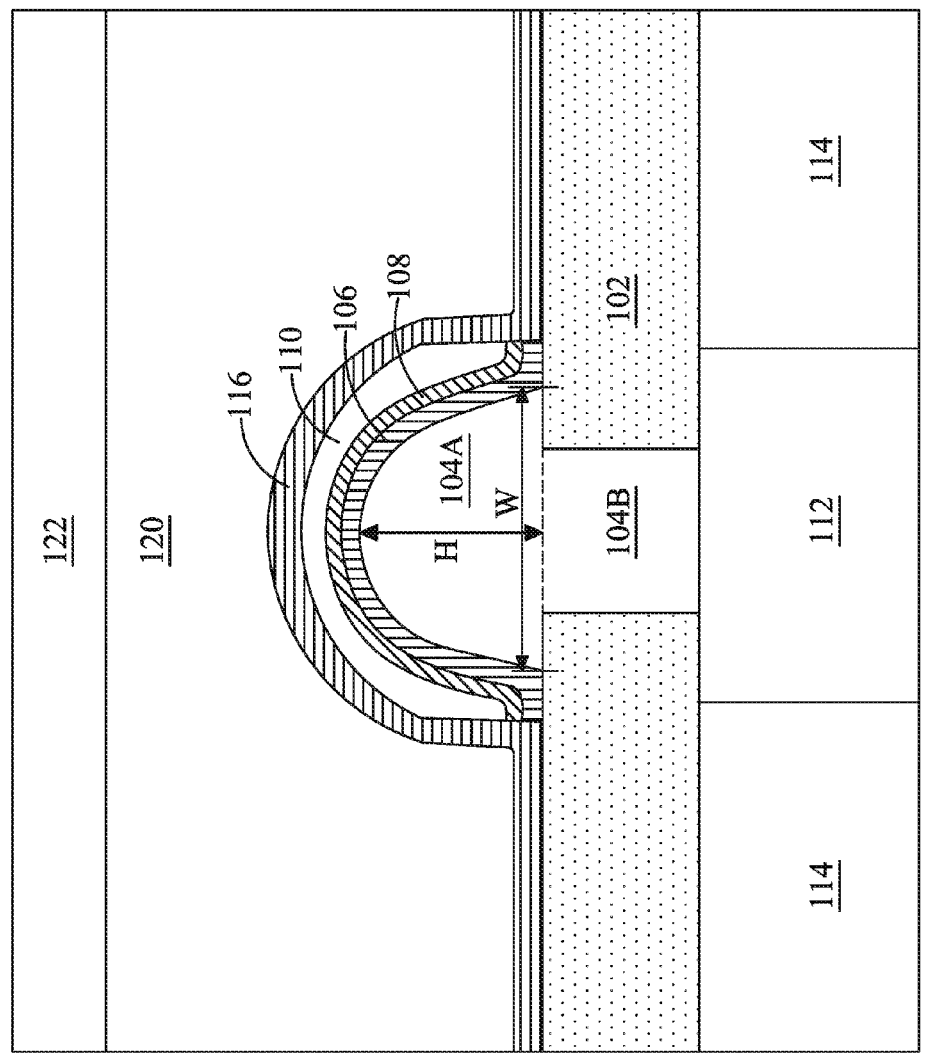
FIGS. 1A and 1B are a cross sectional views of resistive random access memory (RRAM) structures in accordance with various embodiments of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

As discussed, the form voltage is higher than that of the read, reset and the set voltage. A conventional form voltage may be about 3.0 to about 3.5 volts or about 3.5 volts or higher. In an 1T1R RRAM, a drain side of the selector transistor may be damaged during the formation process because the form voltage is larger than operating voltage of the transistor. A reduction of the form voltage reduces the likelihood of transistor damage.

FIG. 1A is a cross sectional view of a resistive random access memory (RRAM) structure embedded in a multilevel interconnect (MLI) structure over a transistor in accordance with various embodiments of the present disclosure. The RRAM structure 100 can reduce the form voltage by increasing the electric field intensity without using additional area. The RRAM structure 100 includes a bottom electrode 104A/B in and over a RRAM stop layer 102, a resistive material layer 106, and a top electrode 110. The bottom electrode is composed of two portions, a via portion 104B embedded in the RRAM stop layer 102 and a non-planar top portion 104A over the via portion and the RRAM stop layer 102. The non-planar portion 104A of the bottom electrode has an apex, or a highest point in a cross section. The cross section may be a parabola, a portion of an ellipse, a catenary, a triangle, or a complex shape having a topmost point. In some embodiments, the topmost portion may be pointy as in a spire or relatively flat as in a flattened catenary. The topmost portion may also have a small planar region. A metal/dielectric layer is disposed below the RRAM stop layer 102 and includes one or more metal features 112 embedded in dielectric layer 114. An optional capping layer 108 may be disposed between the top electrode 110 and the resistive material layer 106. A second RRAM stop layer 116 covers the top electrode 110, capping layer 108, resistive material layer 106, and non-planar portion 104A of the bottom electrode. A dielectric material 120 fills the regions between RRAM structures 100 over the second RRAM stop layer 116. Another dielectric material 122 is disposed over the dielectric material 120. The dielectric material 120 may be formed of the same material as the dielectric material 122 and also dielectric layer 114.

As shown in FIG. 1A, the non-planar portion 104A of the bottom electrode has a height H and a base width W in a cross section. According to various embodiments, the ratio of the height over the base width is greater than about 0.5. In some embodiments, the ratio is about 1 or greater than about 1. According to FIG. 1A, the resistive material layer 106 completely covers the non-planar portion 104A of the bottom electrode, so that the base width of the resistive material layer 106 is larger than the base width of the non-planar portion 104A. The top electrode 110 and the optional capping layer 108 terminate at a continuous surface circumferentially about the RRAM structure.

The RRAM structure 100 has two or more states with different electric resistance values that correspond to a different digital value. The RRAM structure 100 switches from one state to another by applying a predetermined voltage or current to the RRAM structure 100. For example, the RRAM structure 100 has a state of relatively high resistance, referred to as "a high resistance state", and a state of relatively low resistance, referred to as "a low resistance state". The RRAM structure 100 may be switched from the high resistance state to the low resistance state, or from the low resistance state to high resistance state by applying a predetermined voltage or current to the electrodes.

In a memory bit cell having one transistor and one RRAM (1T1R) the bottom electrode 104A/B is electrically connected to a drain electrode of a transistor through the MLI. In some embodiments, the RRAM structure is placed between the fourth metal layer (M4) and the fifth metal layer (M5). In other embodiments, the RRAM structure is placed between other metal layers. In still other embodiments, the RRAM structure is placed more than once between more than two metal layers. The RRAM structure may be placed more than once when the footprint of the RRAM is larger than that of the corresponding transistor so that a one transistor one RRAM match cannot be made in one layer of RRAM.

The bottom electrode 104 may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the bottom electrode from a bottom of via portion 104B to a top of non-planar portion 104A may be between a range about 100-500 nm. The via portion may include one or more layers, which may include a conductive barrier material to a metal feature below. The non-planar portion may also include one or more layers. In one embodiment, the bottom electrode includes a tantalum nitride layer and a titanium nitride layer.

A resistive material layer 106 is formed on the bottom electrode 104 and directly contacts to the bottom electrode 104. The thickness of the resistive material layer 106 may be between about 20-100 nm. The resistive material layer may include one or more oxide of W, Ta, Ti, Ni, Co, Hf, Ru, Zr, Zn, Fe, Sn, Al, Cu, Ag, Mo, Cr. In some cases, silicon may be included to form a composite material. In some embodiments, hafnium oxide and/or zirconium oxide is used.

An optional capping layer 108 is formed over the resistive material layer. In various embodiments, the capping layer is a metal, for example, titanium, hafnium, platinum, and tantalum. The capping layer may have a thickness ranging between about 20 angstroms and about 150 angstroms, or between about 40 angstroms and about 80 angstroms.

A top electrode 110 is formed over the resistive material layer 106 or the optional capping layer 108. The top electrode 110 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the top electrode 110 may be between a range about 100-500 nm.

An 1T1R memory cell is controlled through at least four electrical connections to read, write, and form the memory cell. A gate contact to the transistor controls a gate voltage that allows a channel region to conduct. A body contact may be used to connect to the semiconductor substrate and provide a ground or bias the transistor. A bit line contact is connected to the top electrode 110; and, a source line contact is connected to the source region contact of the transistor.

During memory cell 'form' operation, a specified voltage is conducted across the RRAM structure between the bottom electrode 104A/B and the top electrode 110. The voltage is provided through the transistor from the source line contact across to the bit line contact. The 'form' voltage is usually a different voltage from the voltage used to read and write the memory cell and is usually at a higher absolute value or has a different polarity. In one example, the voltage difference may be between about 3 volts and 3.5 volts, or greater, at about 5 volts. According to various embodiments, the novel shape of the non-planar portion 104A of the bottom electrode increases the electric field at the topmost portion of the non-planar portion that is believed to reduce the form voltage by at least 10%, or between about 15% and about 20%, as compared to a similarly sized RRAM having a rectangular polyhedron top portion. In other words, a form voltage of a RRAM cell in accordance with various embodiments of the present disclosure may be about 3 volts or less, and may be about 2.8 volts or about 2.9 volts.

After the 'form' operation, one or more filament conductors are disposed across the resistive material layer 106. The resistance across the resistive material layer 106 is at a low value and a high current may be passed when the transistor is selected. During the write operation, the one or more filament conductors are broken by passing a voltage different from the 'form' voltage. In some embodiments, the 'write' voltage may have a different polarity than the 'form' voltage. In one example, the voltage difference is about 1 volt. After the one or more filament conductors are broken, the resistance across the resistive material layer 106 is at a high value a low current or no current may be passed when the transistor is selected. Subsequent write operation applies yet a different voltage that is less than the 'form' voltage to reconnect the broken filament conductors. By changing the filament conductors, a high or low resistance is stored in the memory cell that does not change when the power is removed. Either the high resistance or the low resistance may be read as a "0" or "1", respectively. During a read operation, a 'read' voltage is applied across the RRAM structure. In some examples, the 'read' voltage is between about 0.3 volts to about 0.5 volts. The 'read' voltage is much smaller than the 'write' voltage to avoid inadvertent writing of the memory cell to a different value.

A memory cell is usually connected to an array of memory cells either embedded in a logic device or as a stand-alone memory device. Memory cell arrays are organized into bit lines and word lines. The bit line contact is connected to the bit line of the memory cell array and the gate contact is connected to the word line of the memory cell array.

Figure 2A:
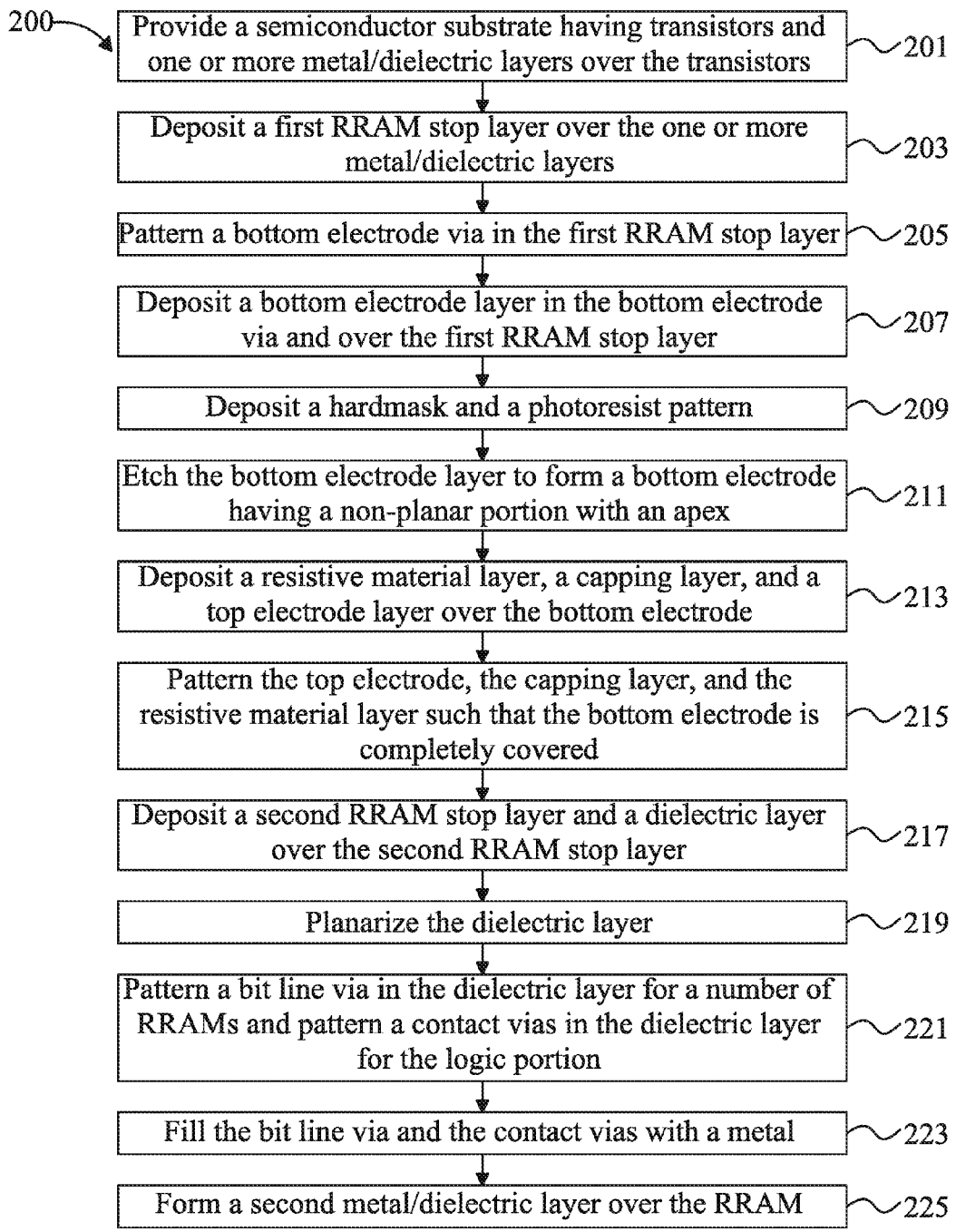
FIGS. 2A and 2B are flowcharts of methods making of a RRAM cell according to aspects of the present disclosure in various embodiments.

FIG. 2A is a flowchart of a method 200 for making a memory device according to aspects of the present disclosure in various embodiments of the RRAM structure of FIG. 1A. Various operations of the method 200 are discussed in association with cross-section diagrams 3A-3G. In operation 201 of method 200, a semiconductor substrate having transistors and one or more metal/dielectric layers over the transistors is provided. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The wafer may be in various stages of fabrication and is processed using the CMOS process. The transistors are formed by known transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, four metal/dielectric layers are formed over the transistors.

In operation 203, a first RRAM stop layer is deposited over the one or more metal/dielectric layers. The first RRAM stop layer may be silicon carbide, silicon oxynitride, silicon nitride, carbon doped silicon nitride or carbon doped silicon oxide. The first RRAM stop layer is selected to have a different etch selectivity than the bottom electrode material. The first RRAM stop layer is deposited over a planarized metal/dielectric layer using a chemical vapor deposition (CVD) process such as plasma enhanced (PE) CVD, high-density plasma (HDP) CVD, inductively-coupled-plasma (ICP) CVD, or thermal CVD.

In operation 205, a bottom electrode via is patterned in the first RRAM stop layer. The bottom electrode via is formed by first depositing a photoresist over the first RRAM stop layer, exposing a portion of the photoresist to a radiation, developing the photoresist, and etching the bottom electrode via in the first RRAM stop layer using the photoresist as an etch mask. FIG. 3A is a cross section diagram of portions of a wafer after operation 205. The wafer 300 includes a RRAM portion 301 and a logic device portion 303. Various operations of method 200 are performed in the RRAM portion 301 and conventional MLI formation is performed in the logic device portion 303. The transistor and metal/dielectric layers below the RRAM level are not shown. The cross section of FIG. 3A includes a metal/dielectric layer 305 including both metal feature 311 and dielectric material 313. A first RRAM stop layer 307 is deposited over the metal/dielectric layer 305 for both the RRAM portion 301 and the logic device portion 303. A bottom electrode via 309 is formed in the first RRAM stop layer 307 over the metal feature 311 in the RRAM portion 301.

Referring back to FIG. 2, in operation 207, a bottom electrode layer is deposited in the bottom electrode via and over the first RRAM stop layer. The bottom electrode layer may be tantalum nitride, titanium nitride, tungsten, or copper deposited using a physical vapor deposition (PVD) process or a plating process. In some cases, a liner or a barrier layer may be deposited first, followed by a deposition of the bulk material using one of the known deposition methods. Because the bottom electrode layer deposition fills the bottom electrode via and covers the first RRAM stop layer, the portion of the bottom electrode layer over the bottom electrode via may have different thickness above the bottom electrode via as compared to the bottom electrode layer not over the bottom electrode via. FIG. 3B is a cross section diagram of portions of a wafer after operation 207 including a bottom electrode layer 315 over the first RRAM stop layer. The bottom electrode layer 315 has a portion in the via, the via portion 315B of the bottom electrode layer, and a portion over the via, the top portion 315A of the bottom electrode layer.

Referring back to FIG. 2, in operation 209 a hardmask layer and a photoresist pattern are formed over the bottom electrode layer. The hardmask layer may be any conventionally used hardmask used as an etch mask. For example, a silicon-based spin-on material or a silicon-based material deposited using CVD, such as silicon nitride, certain types of silicon oxide, and versions of these with doping of carbon, oxygen, and other materials can be used. The layers can also include an antireflective coating to reduce the amount of reflection from the bottom electrode layer during patterning. The photoresist pattern is formed by depositing a photoresist and exposing the photoresist to a light pattern. After exposure, a portion of the photoresist is removed in a developing process. FIG. 3B is a cross section diagram of portions of a wafer after operation 209, including a hardmask layer 317 and a photoresist pattern 319 that is directly over the via portion of the bottom electrode layer 315B. The size and shape of the photoresist pattern to achieved a desired shape of the bottom electrode after etching in operation 211 of FIG. 2A.

Figure 7A:
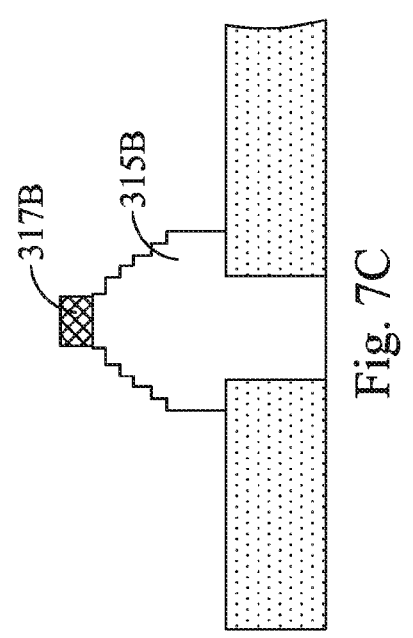
FIGS. 7A-7D are cross sectional diagrams of a partially fabricated RRAM structure during a bottom electrode etch in accordance with various embodiments of the present disclosure.
Figure 7B:
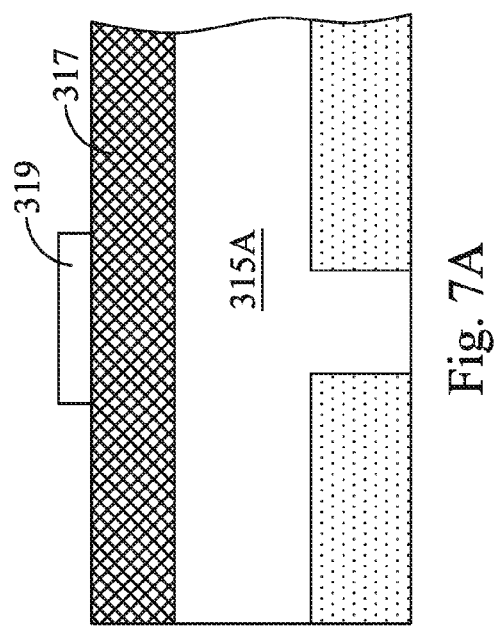

Referring back to FIG. 2A, in operation 211 the bottom electrode is formed by etching the bottom electrode layer. The bottom electrode has a non-planar portion with an apex. A sequence combination of polymer generation and physical bombard etch is used to form a non-planar portion of the bottom electrode having an apex. FIGS. 7A to 7D are cross section diagrams of the bottom electrode before, during, and after the etch process. FIG. 7A is the same as FIG. 3B, including a patterned photoresist 319 over a hardmask layer 317. In the first etch step to form the cross sectional diagram of FIG. 7B, the hardmask layer 317 and bottom electrode layer 315A are etched according to the patterned photoresist 319 in an anisotropic process to form the hardmask pattern 317A. The anisotropic etch involves physical bombardment of the hardmask layer 317, usually with inert ions such as argon. The anisotropic etch also removes the photoresist.

Figure 7C:
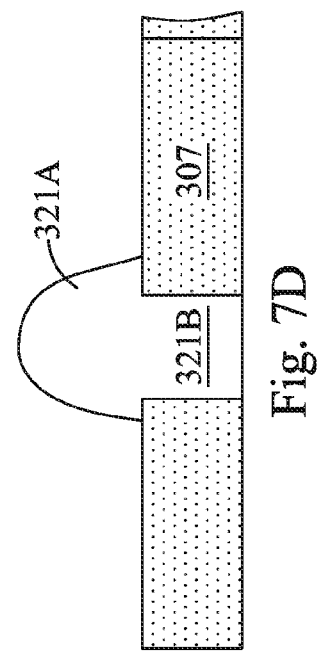

The etch process then changes to a ladder etch of the bottom electrode. The sequence combination includes both isotropic etch and anisotropic etch. In a ladder etch, material is removed from the hardmask isotropically in steps while the underlying bottom electrode is etched anisotropically. As the hardmask is reduced in size, polymers that protect the sidewalls are generated to reduce sidewall etching. The etch sequence may include isotropic etching of the hardmask pattern 317A and the physical bombardment of the bottom electrode layer 315A together or separately. Polymer generating etchants include CxFy, such as $C_4F_8$, and chlorocarbon containing etchants. FIG. 7C is a cross sectional diagram of the top portion of the bottom electrode layer 315B during the ladder etch. The hardmask pattern 317B is significantly smaller than the hardmask pattern 317A. Because the polymers protect the sidewalls very well and the top surfaces not well, the bottom electrode layer 315B has a staircase shape. After the hardmask pattern is consumed by the ladder etch, the etch process transitions to an isotropic etch of the bottom electrode layer 315B.

Figure 7D:
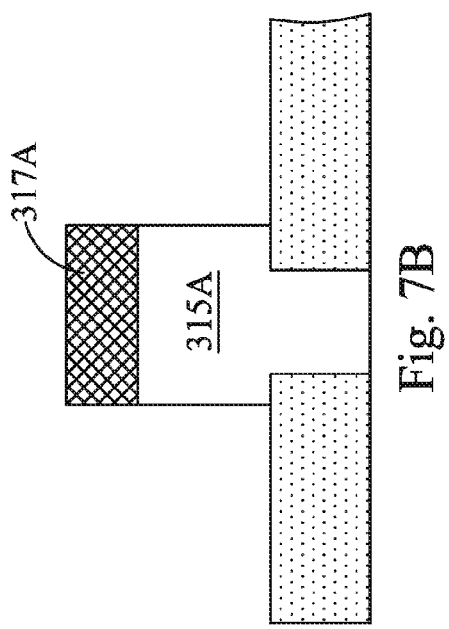

FIG. 7D is a cross section diagram of portions of a wafer the isotropic etch according to some embodiments. A curved feature 321 is formed in a shape of a mound or half-ellipsoid. By controlling the shape and size of the photoresist pattern and the sequence combination of polymer generation and physical etch, a non-planar portion 321A of the bottom electrode is formed having an apex, or a peak in a cross section. The apex is the part under the middle of the photoresist and may not be not substantially etched. By adjusting the ratio of anisotropic and isotropic etch and the number of steps during the ladder etch, a variety of shapes results. In some RRAM cell embodiments, the non-planar portion 321 is a mound, like a pseudo hemisphere, a half-ellipsoid, or a pyramid. The cross section may be a half-ellipse, a parabola, a catenary, or a triangle.

Referring back to FIGS. 2A and 3C, the bottom electrode 321 is formed in operation 211 with two portions: a non-planar portion 321A above the first RRAM stop layer 307 and a via portion 321B embedded in the first RRAM stop layer 307. As discussed in reference to FIG. 1A, the non-planar portion 321A has a base width W and a height H in a cross section. A ratio range of H/W is defined for the non-planar portion 321. A high ratio results in a sharper apex that has a more intense electric field during the form operation and reduces the form voltage. Thus in some embodiments, the cross section of the non-planar portion 321A is roughly triangular. An edge portion of the non-planar portion 321A overlaps the first RRAM stop layer 307 as overlay margin. In some embodiments, the H may be about 100-150 nanometers (nm) and the W may be about 100-150 nm with an overlay margin of 15 nm on either side.

Referring back to FIG. 2A, in operation 213 a resistive material layer, a capping layer, and a top electrode layer is deposited sequentially over the bottom electrode. The resistive material layer of the RRAM is a metal oxide, which may be hafnium oxide, zirconium oxide, aluminum oxide, nickel oxide, tantalum oxide, titanium oxide, and other known oxides used as a resistive material layer. The metal oxide may have a non-stoichiometric oxygen to metal ratio. Depending on the method of deposition, the oxygen to metal ratio and other process conditions may be tuned to achieve specific resistive material layer properties. In some embodiments, the metal oxide is a transition metal oxide. In other embodiments, the resistive material layer is a metal oxynitride.

The resistive material layer may be formed by a suitable technique, such as atomic layer deposition (ALD) with a precursor containing a metal and oxygen. Other chemical vapor deposition (CVD) techniques may be used. In another example, the resistive material layer may be formed by a physical vapor deposition (PVD), such as a sputtering process with a metallic target and with a gas supply of oxygen and optionally nitrogen to the PVD chamber. In yet another example, the resistive material layer may be formed an electron-beam deposition process. The resistive material layer may have a thickness ranging between about 20 angstroms and about 100 angstroms, or between about 40 angstroms and about 60 angstroms. Thicker resistive material layers result in higher form voltage. However, a thin resistive material layer may be susceptible to current leakage if over etched and is more sensitivity to surface and thickness non-uniformity.

The capping layer of the RRAM over the resistive material layer is a metal. In various embodiments, the capping layer is a metal, for example, titanium, hafnium, platinum, and tantalum. The capping layer may be deposited using a PVD process, a CVD, for example, an ALD process. The capping layer may have a thickness ranging between about 20 angstroms and about 100 angstroms, or between about 40 angstroms and about 80 angstroms.

The top electrode may be metal, metal-nitride, doped polysilicon or other suitable conductive material. For example, the top electrode may be tantalum nitride, titanium nitride, or platinum. The top electrode may be formed by PVD, CVD including ALD, or other suitable technique and has a thickness ranging between about 100 angstrom and about 500 angstroms, or about 200 to about 250 angstroms. Alternatively, the top electrode includes other suitable conductive material to electrically connect the device to other portion of an interconnect structure for electrical routing.

In some embodiments, the layers are deposited in one system without breaking vacuum. Specifically, one or more of the layers may be deposited in the same chamber or each one in a different chamber on the same vacuum system. In other embodiments, more than one semiconductor processing system is used. FIG. 3D is the cross section diagram showing top electrode layer 327 over capping layer 325 over resistive material layer 323 conformally over the non-planar portion 321A of the bottom electrode.

Referring back to FIG. 2A, in operation 215 the top electrode, the capping layer, and the resistive material layer are patterned such that the bottom electrode is completely covered. The patterning includes a photolithography operation where a photoresist is deposited, a pattern is defined by exposing photoresist to a radiation, and developing the photoresist to create a photoresist pattern. The photoresist pattern is then used as an etch mask to protect desired portions of the RRAM structure. As shown in FIG. 3E, a portion of the top electrode layer and a portion of the capping layer are removed from the RRAM portion 301 of the wafer. All of the top electrode layer and capping layer are removed from the logic device portion 303 of the wafer. As shown in FIG. 3E, a top electrode 333, a capping layer 331, if used, and a resistive material layer 329 cover the non-planar portion 321A. In some embodiments, the capping layer and the top electrode may be formed of the same material, but using different processes so as to vary a specific material property. The etch process stops when first RRAM stop layer 307 is reached. Techniques are available to detect the end of etching when a new material layer is reached so as to limit the amount of over etching.

Referring back to FIG. 2A, in operation 217 a second RRAM stop layer and a dielectric layer over the second RRAM stop layer is deposited. The second RRAM stop layer may be the same material as the first RRAM stop layer. The second RRAM stop layer may be silicon carbide, silicon oxynitride, silicon nitride, carbon doped silicon nitride or carbon doped silicon oxide. The second RRAM stop layer is selected to have a different etch selectivity than the overlying dielectric layer material. The second RRAM stop layer is deposited conformally over the RRAM structure using a chemical vapor deposition (CVD) process such as plasma enhanced (PE) CVD, high-density plasma (HDP) CVD, inductively-coupled-plasma (ICP) CVD, or thermal CVD. The conformity process window depends partially on the aspect ratio of the RRAM structure, which depends on the H/W ratio of the non-planar portion of the bottom electrode. Thus in various embodiments, the H/W ratio is not more than about 2 or 3.

The dielectric layer 337 is deposited over the second RRAM stop layer 335. The dielectric layer may be the same material as the dielectric material 313 in the metal/dielectric layer 305 of FIGS. 3A to 3F. The dielectric layer may be silicon oxide, low-k silicon oxide such as a porous silicon oxide layer, or other commonly used interlayer dielectric (ILD) material. The dielectric layer completely fills the area between RRAM structures and covers the RRAM structures.

Referring back to FIG. 2A, in optional operation 219 the dielectric layer is planarized. Depending on the method of deposition, the dielectric layer may have an uneven top surface. During subsequent contact etch, an uneven top surface may cause unwanted overetching and some portion and underetching in other portions. A CMP process is usually used to planarize the dielectric layer. FIG. 3F is a cross section view after operation 219. The RRAM structure is conformally covered by second RRAM stop layer 335. A planarized dielectric layer 337 fills the space between RRAM structures and covers the RRAM structure.

Figure 4A:
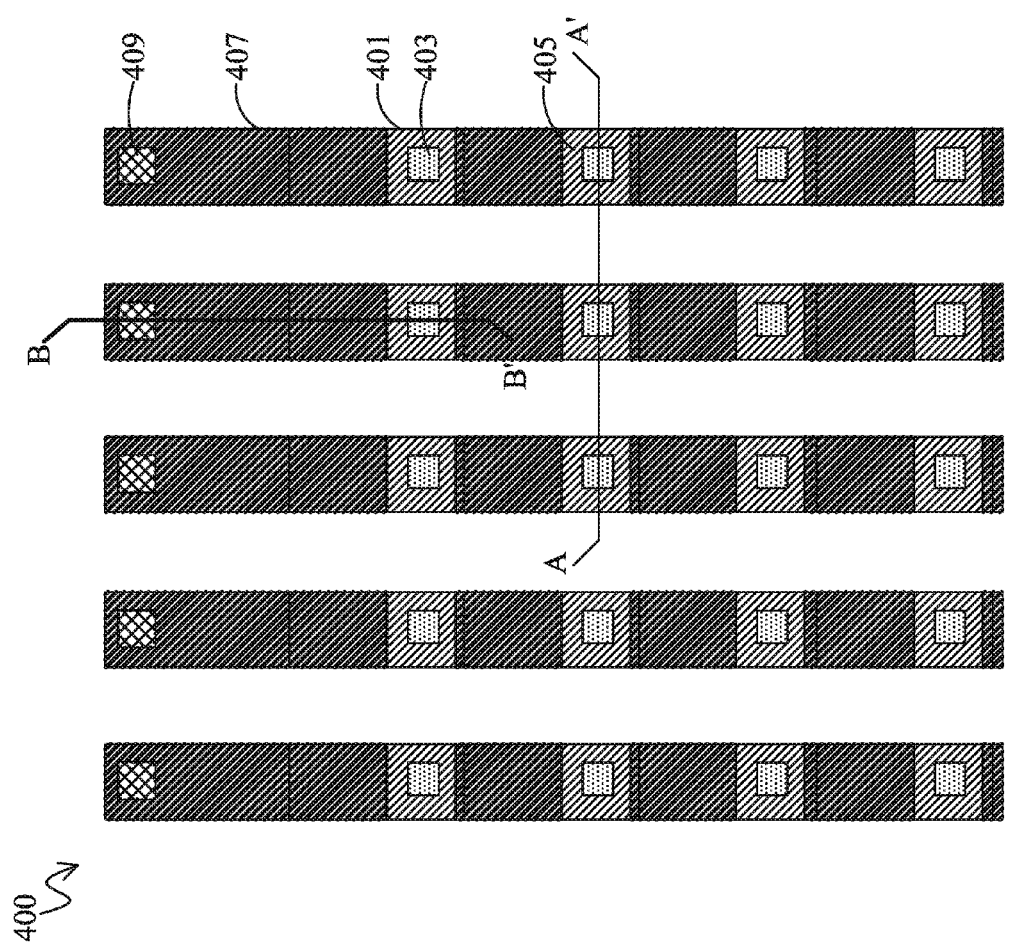
FIG. 4A is a layout diagram of a portion of a RRAM cell array in accordance with various embodiments of the cross sectional diagrams of FIGS. 3A-3G and the method embodiments of FIG. 2A.

A bit line via is patterned in the dielectric layer for a number of RRAMs and contact vias are patterned in the dielectric layer for the logic portion in operation 221. The bit line via, when filled, connects the top electrode from several RRAMs, for example, a column of RRAMs in an array, to a metal line and may not be present in a cross section diagram of a RRAM as shown in FIG. 3G. FIGS. 4A and 4C show the position of the bit line vias in an RRAM cell array. The bit line vias for the RRAM portion and the contact vias in the logic portion may be patterned together in some embodiments and separately in other embodiments. Because the logic contact via extends through more dielectric material and also extends through the first RRAM stop layer, a single etch that etches sufficiently for the logic contact via may overetch the bit line via. However, adjusting the via size and operating parameter may compensate for the difference in depth so that one photomask and one etch step is used together for both.

Referring back to FIG. 2A, in operation 223, the bit line via and the contact via are filled with a conductive material, usually a metal. The filling may also include one or more liner and barrier layers in additional a metal conductor. The liner and/or barrier may be conductive and deposited using CVD or PVD. The metal may be deposited using PVD or one of the plating methods, such as electrochemical plating. FIG. 3G is a cross section diagram of the partially fabricated device including a RRAM structure in a RRAM portion 301 and a logic portion 303. The bit line via is not shown in the cross section of FIG. 3G because the bit line via is on a different plane. Contact via 341 is shown contacting the metal feature 311 in the logic portion.

In alternative embodiments, operations 221 and 223 pattern and fill top electrode vias and contact vias. The top electrode via extends from the top of the dielectric layer deposited in operation 217 to the top electrode over each RRAM. Operation 221 may be performed in multiple steps: in a first step, a first pattern and etch stops on top of the second RRAM stop layer in the RRAM portion and in a second step, the second RRAM stop layer is etched through to the top electrode. The first step of pattern and etch is performed using known processes. The subsequent step of etching through the second RRAM stop layer may be performed together with contact etching in the logic device.

Then, a contact via is patterned in the dielectric layer for the logic portion. The contact via extends from the top of the dielectric layer to the metal features in the metal/dielectric layer below the first RRAM stop layer. A first pattern and etch stops on top of the first RRAM stop layer in the logic portion and subsequently, the first RRAM stop layer is etched through to the metal feature in the metal/dielectric layer. The first step of pattern and etch is performed using known processes. The subsequent step of etching through the first RRAM stop layer may be performed together with top electrode via etching in the RRAM portion.

In the alternative embodiments, the top electrode via and the contact via may use separate photolithographic and etching operation because the difference in their depths are bigger than that of the bit line via and the contact via embodiments.

Referring back to FIG. 2A, in operation 225 a second metal/dielectric layer is formed over the RRAM. The second metal/dielectric layer may be formed in a similar way as the first metal/dielectric layer under the RRAM structure. In some embodiments, excess metal from the bit line via and the contact via filling are removed by planarization, new dielectric material deposited, metal line trenches patterned and etched in the new dielectric material, and metal lines filled to form the second metal/dielectric layer. In some embodiments, the metal line trenches are patterned and etched even before the bit line via and the contact via are filled. When dimensions are such that the filling process permits, one filling operation can fill both the contacts and the metal trenches. The first metal/dielectric layer may be a fourth metal layer on the wafer and the second metal/dielectric layer may be a fifth metal layer on the wafer. After operation 225, the RRAM structure of FIG. 1A is complete in accordance with various embodiments of the present disclosure. FIG. 3G is a cross section view after operation 225 including a second metal/dielectric layer with metal feature 339.

FIG. 4A is a RRAM cell array 400 layout according to aspects of the present disclosure corresponding to the RRAM cell of FIG. 1A. The RRAM cells 401 are arranged in columns and rows, for example, five columns and four rows as shown. A smaller rectangle in each RRAM cell 401 represents the via portion 403 of a bottom electrode. The larger rectangle 405 represents the layout of the non-planar portion 405 of the bottom electrode. A long rectangle covering entire columns corresponds to the area for the top electrode/bit line 407. The bit line 407 connects the top electrode from each of the RRAM cells 401 to the bit line via 409.

FIG. 4B is a cross sectional diagram of the RRAM cell array 400 from cut line A-A'. View A-A' of FIG. 4B spans three RRAMs of a row in an RRAM cell array. Each of the RRAMs are separately connected to respective transistors through the bottom electrode. The RRAMs in one column are connected together through the bit line/top electrode to the bit line via as shown in view B-B' of FIG. 4C. A cross section view from the cut line B-B' on FIG. 4A spanning the bit line via and one RRAM is shown in FIG. 4C. The top electrode 407 acts as the bit line and no separate bit line in the metal layer is provided.

Several photomasks used in the RRAM memory cell fabrication process are not used in the traditional CMOS fabrication process. The first additional photomask is one used for bottom electrode via patterning. The second additional photomask is one used for patterning the non-planar portion of the bottom electrode. The third additional photomask is one used for the top electrode patterning, down through the resistive material layer. Because the bit line via may share a photomask with the contact via in the logic portion, no additional photomask is used for the bit line via. Thus, the embedded RRAM described thus far may be made with a minimum of three additional photomasks as compared to traditional CMOS fabrication processes without RRAM structures. In some embodiments, one of the additional photomasks may be a mask that is used in another operation that happens to have a pattern that can be reused. In some embodiments, a reusable pattern may be one of an opposite photoresist. In other embodiments, process parameter adjustments in one or more of the photolithography operations may allow the use of a photomask that does not overlap perfectly. For example, a positive photoresist may be used instead of a negative photoresist, or vice versa, to cause a different pattern when the exposure operation is performed at an angle.

The embodiments described as disclosed in association with FIGS. 1A, 2A, 3A-3G and 4A-4C pertains to one aspect of the present disclosure. In another aspect, the process flow and basic RRAM structure may be used in a situation where a number of RRAMs share the bottom electrode, as described below in association with FIGS. 1B, 2B, 5A-5E, and 6A-6C. Because the basic RRAM structure and methods are similar to the embodiment of FIG. 1A, only the differences are described in detail and other details are not repeated.

Figure 1B:
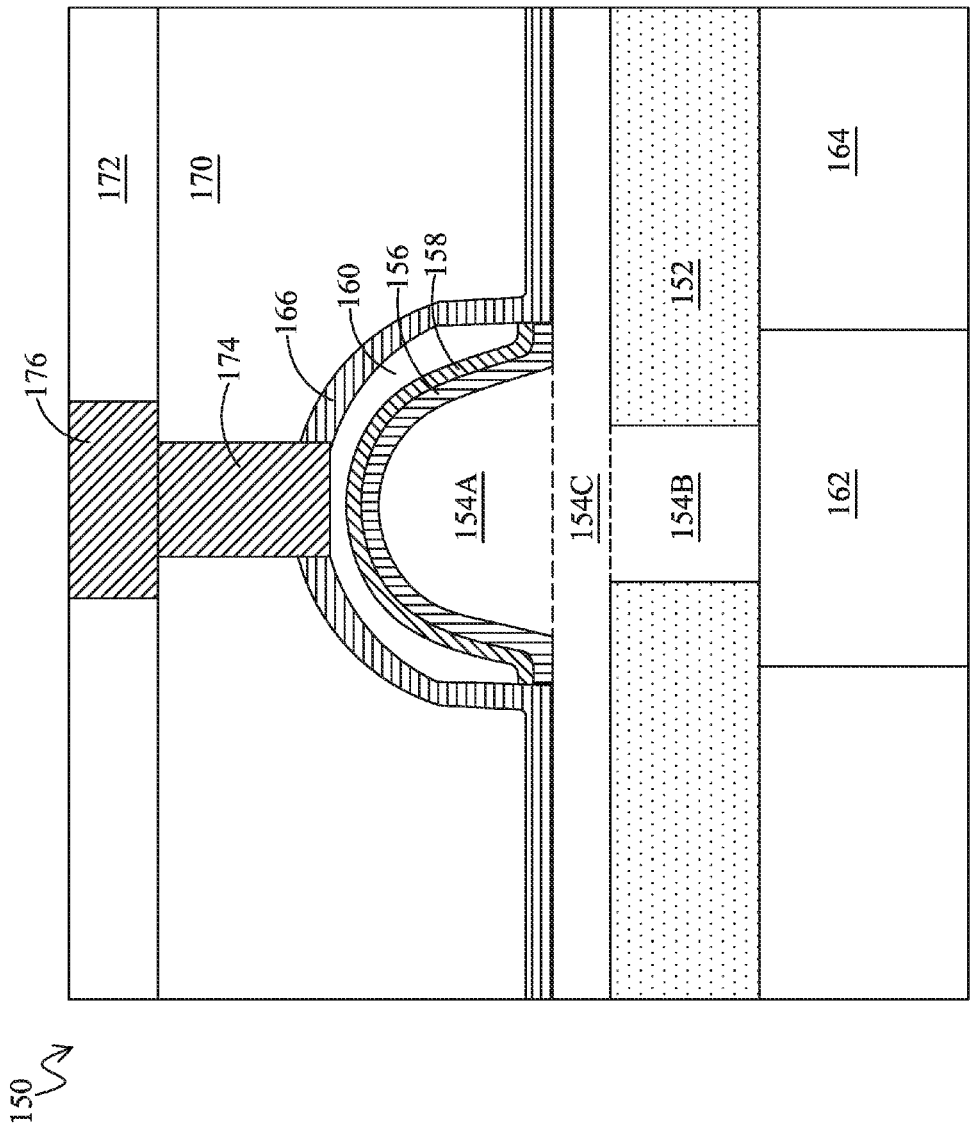

FIG. 1B is a cross sectional view of a resistive random access memory (RRAM) structure embedded in a multilevel interconnect (MLI) structure over a transistor in accordance with the continuous bottom electrode embodiments of the present disclosure. The RRAM structure 150 can reduce the form voltage by increasing the electric field intensity without using additional area. The RRAM structure 150 includes a bottom electrode 154A/B/C in and over a RRAM stop layer 152, a resistive material layer 156, and a top electrode 160. The bottom electrode is composed of three portions, a via portion 154B embedded in the RRAM stop layer 152, a planar portion 154C over the via portion 154B and the RRAM stop layer 152, and a non-planar portion 154A over the planar portion 154C. Planar portion 154C spans over a number of RRAMs in at least one direction. In a cross section as shown in FIG. 1B, the planar portion 154C is wider than the via portion 154B and also wider than a base of the non-planar portion 154A. The non-planar portion 154A of the bottom electrode has an apex, or a highest point in a cross section. The cross section may be a parabola, a portion of an ellipse, a catenary, a triangle, or a complex shape having a topmost point. In some embodiments, the topmost portion may be pointy as in a spire or relatively flat as in a flattened catenary. The topmost portion may also have a small planar region. A metal/dielectric layer is disposed below the RRAM stop layer 152 and includes one or more metal features 162 embedded in dielectric layer 164. An optional capping layer 158 may be disposed between the top electrode 160 and the resistive material layer 156. A second RRAM stop layer 166 covers the top electrode 160, capping layer 158, resistive material layer 156, and non-planar portion 154A of the bottom electrode. A dielectric material 170 fills the regions between RRAM structures 150 over the second RRAM stop layer 166. Another dielectric material 172 is disposed over the dielectric material 170. The dielectric material 170 may be formed of the same material as the dielectric material 172 and also dielectric layer 164. A top electrode via 174 is embedded in the dielectric material 170 filled with a metal and contacts the top electrode 160 through the second RRAM stop layer 166. A bit line 176 directly contacts the top electrode via 174 across several RRAM structures.

The embodiment of FIG. 1B includes a planar portion 154C of the bottom electrode that connects the bottom electrode of multiple RRAM cells across rows or columns or entire array. The connection may be used for a forming operation to bypass the select transistor and avoid damage that can be caused by the higher voltage during the forming operation. During normal operation, the shared connection of the bottom electrode does not affect reading or writing of the RRAM cells.

Figure 2B:
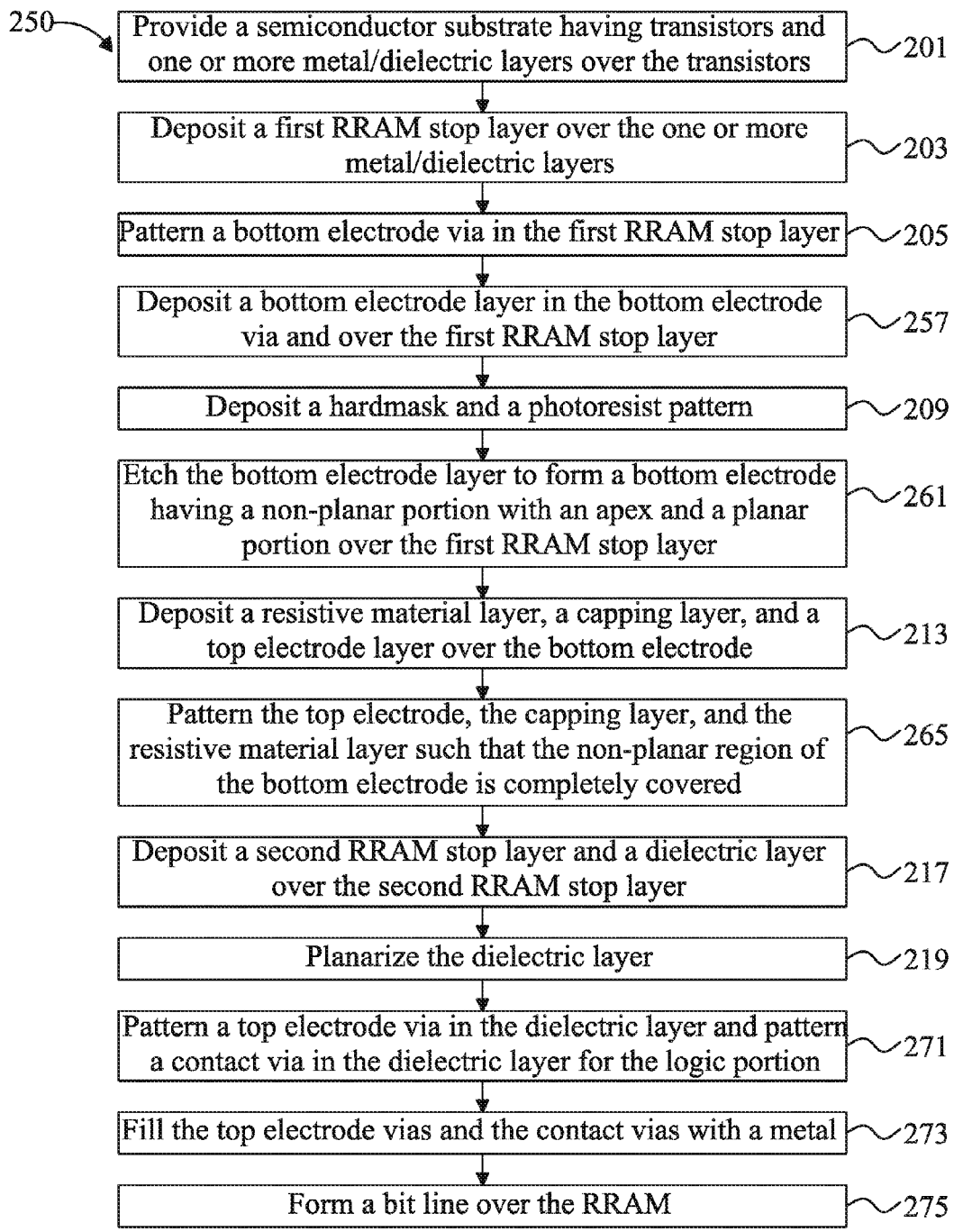

FIG. 2B is a flowchart of a method 250 for making a memory device according to aspects of the present disclosure in various embodiments of the RRAM structure of FIG. 1B. Various operations of the method 250 are discussed in association with cross-section diagrams 5A-5E. Where an operation is same as that of method 200 of FIG. 1A, the operation is labeled using the same element number and details are not repeated. The method 250 starts with operations 201, 203, and 205, which are the same as operations 201, 203, and 205 of method 200, corresponding to cross section FIG. 3A. In operation 257, a bottom electrode layer is deposited in the bottom electrode via and over the first RRAM stop layer, just as in operation 207 of FIG. 2A corresponding to cross section FIG. 3B; however, the bottom electrode layer deposited in operation 257 is thicker.

Referring to FIG. 2B, in operation 209 a hardmask and a photoresist pattern is formed for each RRAM over the bottom electrode via. This operation is the same as operation 209 of FIG. 2A, with the exception that the hardmask thickness and the photoresist pattern may be different to form a bottom electrode having three portions in operation 261. In operation 261, the bottom electrode layer is etched to form a bottom electrode having a non-planar portion with an apex and a planar portion. The etch process is similar to that described in operation 211 with the exception of the stop point. Instead of stopping the etch when the first RRAM stop layer is exposed, the etch is stopped before the first RRAM stop layer is exposed, leaving a planar portion layer as shown in FIG. 5A. According to FIG. 5A, the resulting bottom electrode has three portions, a non-planar portion 505A, a planar portion 505C, and a via portion 505B. The formation and structure of the non-planar portion 505A is the same as the non-planar portion 321A of FIG. 3C. The planar portion 505C extends over both the RRAM portion 301 and the logic portion in FIG. 5A and may be about 100 nm to about 200 nm thick or about 50 nm to about 500 nm thick.

Referring to FIG. 2B, in operation 213 a resistive material layer, a capping layer, and a top electrode layer is deposited over the bottom electrode. This operation is the same as operation 213 of FIG. 2A, with the exception that the various layers are deposited over the planar portion of the bottom electrode in the logic portion and not over the first RRAM stop layer as in the embodiments of FIG. 2A. FIG. 5B shows the resulting cross section, with the planar portion 505C of the bottom electrode, the resistive material layer 507, the capping layer 509, and the top electrode layer 511 over the first RRAM stop layer 513 in the logic portion 503.

Referring to FIG. 2B, in operation 265 the top electrode, the capping layer, and the resistive material layer are patterned such that the bottom electrode is completely covered. As shown in FIG. 5C, in the RRAM portion 501, this operation 265 is the same as operation 215 of FIG. 2A; however, in the logic portion 503, this operation further removes the planar portion 505C of the bottom electrode and exposes the first RRAM stop layer 513. In the logic portion 503, having a continuous layer of conductive bottom electrode material would connect different metal features in that metal layer. In some embodiments, the planar portion 505C of the bottom electrode is patterned in both the RRAM portion 501 and logic portion 503. The patterning in the logic portion allows the bottom electrode to be used as an additional interconnect between two metal layers, perhaps as a mezzanine layer between M4 and M5. The patterning in the RRAM portion allows additional input voltage in additional to the word line and transistor. However, care must be taken to design the circuit such that no parasitic electrical circuits can result that affects the functionality of the RRAM cells.

Operations 217 and 219 of FIG. 2B are the same as operation 217 and 219 of FIG. 2A, with the result shown in FIG. 5D. Next, in operation 271 top electrode via in the RRAM portion for each RRAM and contact via in the logic portion are patterned in the dielectric layer. The top electrode via extends from the top of the dielectric layer deposited in operation 217 to the top electrode over each RRAM. The contact via extends from the top of the dielectric layer to the metal features in the metal/dielectric layer below the first RRAM stop layer. The top electrode via and the contact via may be patterned and etched together using one photomask or separately using different photomasks.

Figure 5E:
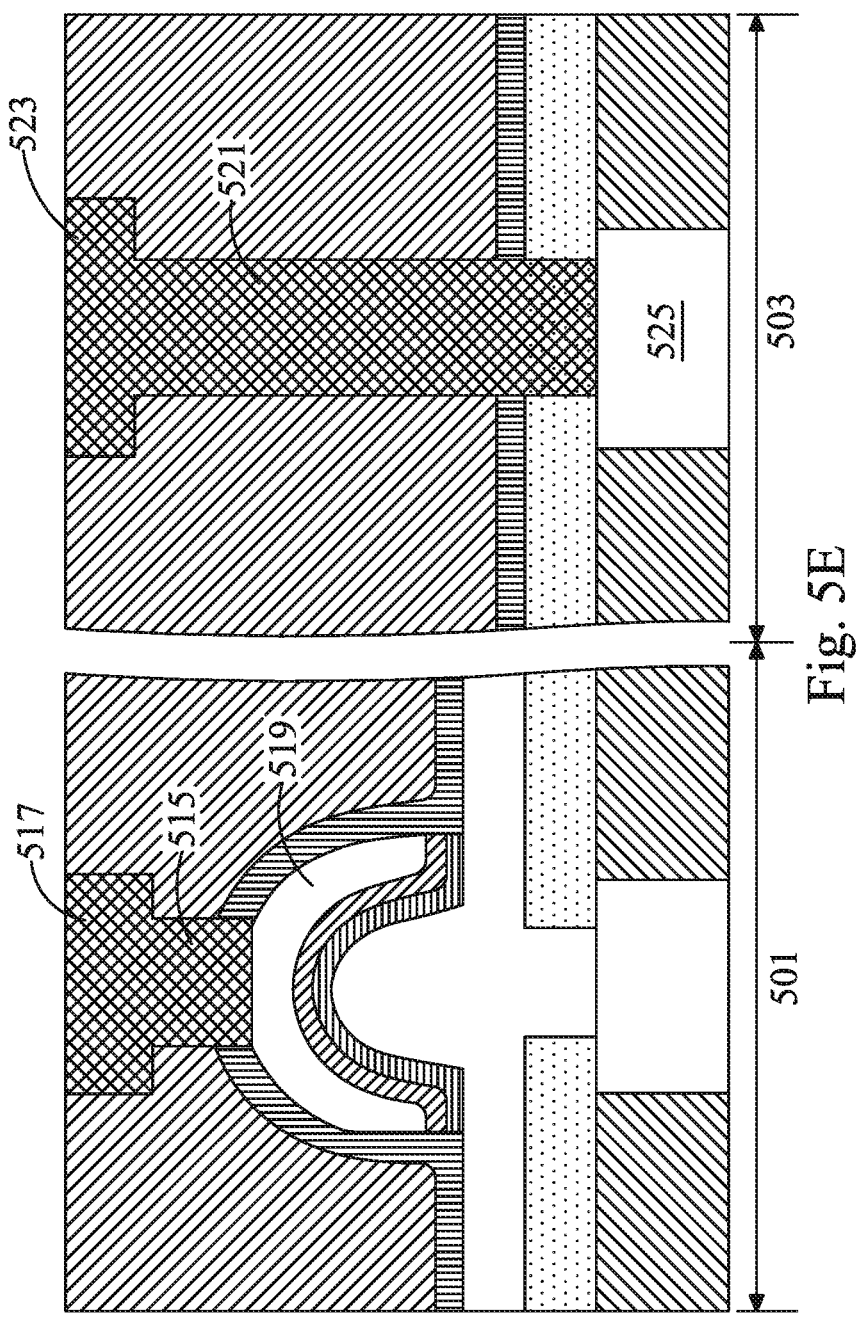

Referring to FIG. 2B, in operation 273 the top electrode vias and the contact vias are filled with a metal. The via filling operation is the same as the via filling operation 223 of FIG. 2A, which may include one or more layers with at least one layer deposited using a plating technique. In operation 275 a bit line is formed over the RRAM. The bit line is formed in the metal/dielectric layer over the dielectric layer deposited in operation 217. FIG. 5E is a cross section diagram of a RRAM portion 501 and a logic portion 503 after various operations of FIG. 2B. A top electrode via 515 connects the bit line 517 to the top electrode 519 in the RRAM portion. A contact via 521 connects the metal feature 525 from a metal/dielectric layer below the RRAM structure, usually M4, to a metal feature 523 in a metal/dielectric layer over the RRAM structure, usually M5.

Figure 6A:
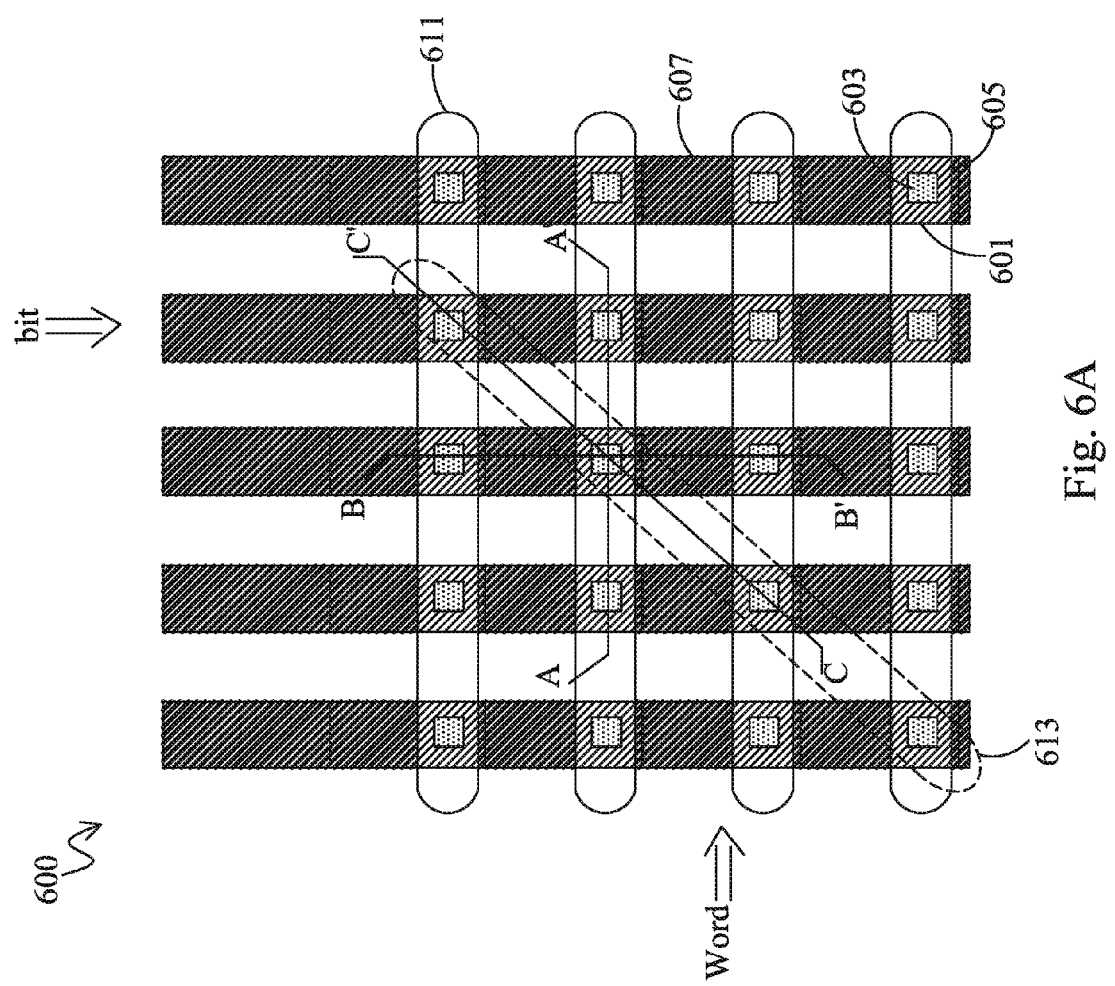
FIG. 6A is a layout diagram of a portion of a RRAM cell array in accordance with various embodiments of the cross sectional diagrams of FIGS. 5A-5E and the method embodiments of FIG. 2B.

FIG. 6A is a RRAM cell array 600 layout according to aspects of the present disclosure corresponding to the RRAM cell of FIG. 1B. The RRAM cells 601 are arranged in columns and rows, for example, five columns and four rows as shown. A smaller rectangle in each RRAM cell 601 represents the via portion 603 of a bottom electrode. The larger rectangle 605 represents the layout of the non-planar portion 605 of the bottom electrode. A long rectangle covering entire columns corresponds to the layout for the bit line 607. The bit line 607 connects to the top electrode from each of the RRAM cells 601 through the top electrode vias.

Figure 6B:
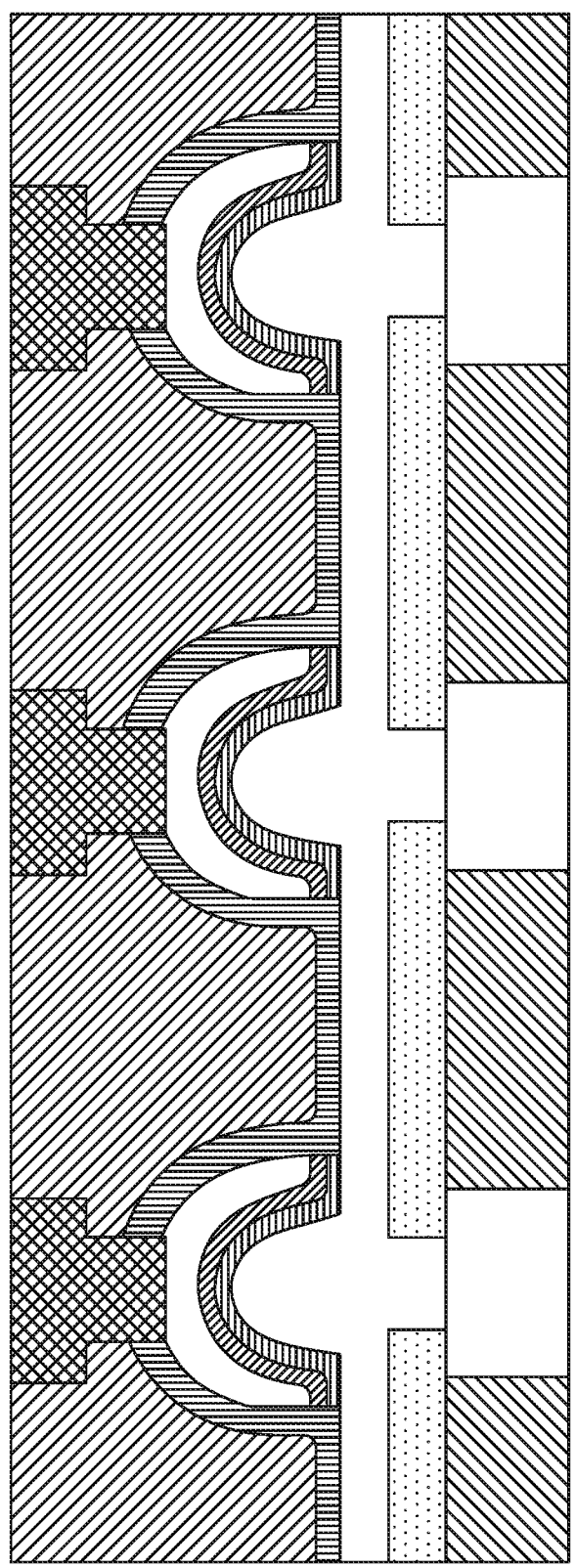
FIGS. 6B and 6C are cross sectional diagrams from cut lines in FIG. 6A in accordance with various embodiments of the cross sectional diagrams of FIGS. 5A-5E and the method embodiments of FIG. 2B.
Figure 6C:
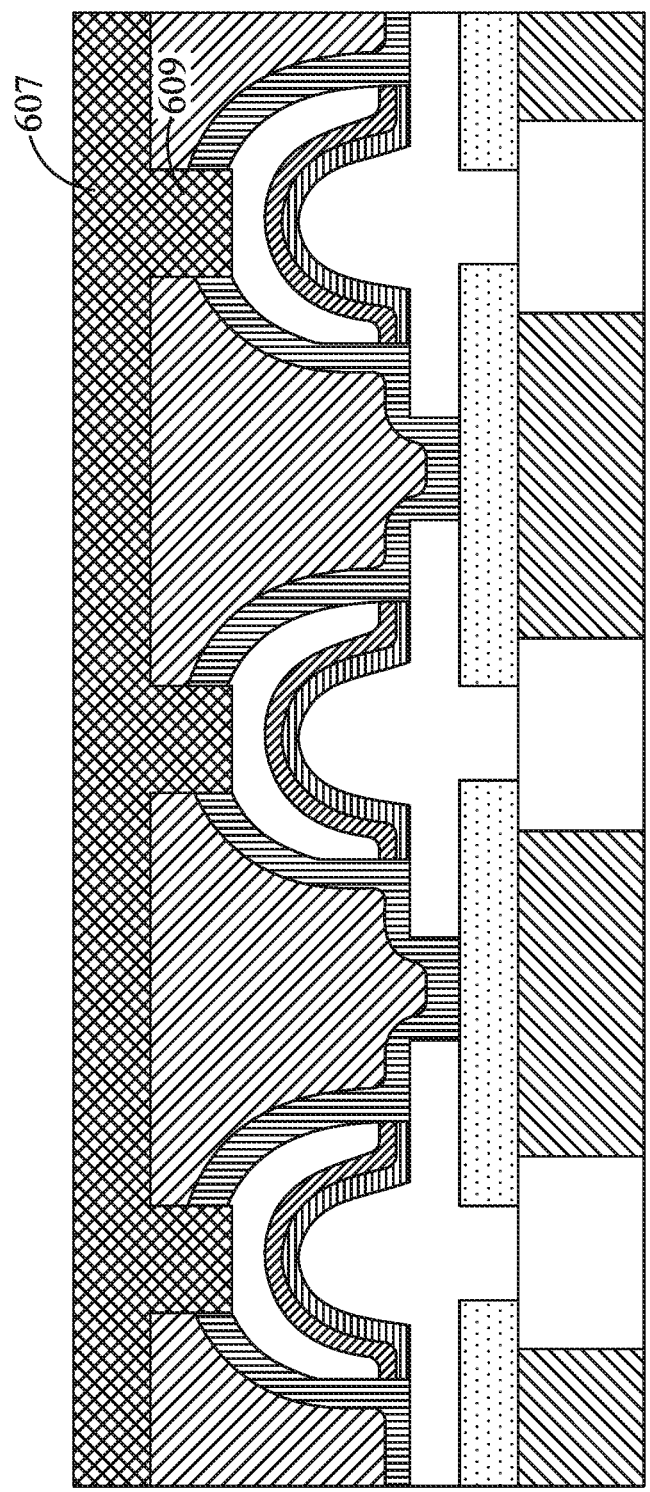

FIG. 6B is a cross sectional diagram of the RRAM cell array 600 from cut line A-A'. View A-A' of FIG. 6B spans three RRAMs of a row in an RRAM cell array. Each of the RRAMs are separately connected to respective transistors through the bottom electrode. As shown, the planar portion of the bottom electrode spans the word line. A cross section view from the cut line B-B' on FIG. 6A spanning three RRAMs is shown in FIG. 6C. The bit line 607 is provided in the metal/dielectric layer over the RRAMs and connected to the RRAMs through top electrode vias 609.

Referring back to FIG. 6A, the RRAM cell array 600 layout further includes planar portion 611 of the bottom electrode that spans the word line. Because the word line, the bit line, and the transistor have all to be selected to select the RRAM, having the planar portion 611 does not interfere with normal operation of the RRAM cell array. However, a feature of the cell array structure is that the planar portion 611 may be connected to a separate transistor such that when turned on, can provide the higher form voltage without being damaged and without affecting the small "select" transistor assigned to each RRAM. Because many RRAM cells can share this "forming" transistor, additional silicon footprint is limited.

In an alternative embodiment, the planar portion of the bottom electrode is patterned in a diagonal such as pattern 613, instead of pattern 611. FIG. 6B shows the cross section from view C-C'. In the alternative embodiment, the risk of a parasitic circuit from having the planar portion of the bottom electrode is minimized. Because the word line, the bit line, and the transistor have all to be selected to select the RRAM, no RRAM cell diagonally adjacent to each other can share the word line, the bit line, or the gate selector for the transistor. The planar portion 613 may be connected to a "forming" transistor as described above.

In one aspect, the present disclosure pertains to an RRAM. The RRAM includes a bottom electrode having a via portion and a non-planar portion, a resistive material layer conformally covering the non-planar portion of the bottom electrode, and a top electrode over the resistive material layer. The via portion of the bottom electrode is embedded in a first RRAM stop layer and the non-planar portion has an apex and is centered above the via portion.

In another aspect, the present disclosure pertains to an RRAM cell array having a plurality of RRAM cells organized in columns and rows and a bit line connecting a column of RRAM cells. Each RRAM cell s includes a transistor; an RRAM structure that includes a bottom electrode having a via portion and a non-planar portion, a resistive material layer on the bottom electrode, a capping layer on the resistive material layer, a top electrode over the resistive material layer, and a second RRAM stop layer over at least a portion of the top electrode. The via portion of the bottom electrode is embedded in a first RRAM stop layer and the non-planar portion has an apex and is centered above the via portion. In some embodiments, the bottom electrode further includes a planar portion and connects a number of RRAM cells.

In yet another aspect, the present disclosure pertains to a method for making a RRAM cell arrays. The method includes forming a plurality of transistors on a semiconductor substrate, depositing a first RRAM stop layer, etching a bottom electrode via in the first RRAM stop layer, depositing a bottom electrode layer in the bottom electrode via and over the first RRAM stop layer, depositing a hardmask and a photoresist pattern, etching the bottom electrode layer to form a bottom electrode having a non-planar portion with an apex, depositing a resistive material layer, a capping layer, and a top electrode layer over the bottom electrode, forming a top electrode by patterning and etching the top electrode layer, the capping layer and the resistive material layer, and depositing a second RRAM stop layer and a dielectric layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a resistive random access memory (RRAM) structure cell array, the method comprising:
    forming a plurality of transistors on a semiconductor substrate;
    depositing a first RRAM stop layer;
    etching a bottom electrode via in the first RRAM stop layer;
    depositing a bottom electrode layer in the bottom electrode via and over the first RRAM stop layer;
    depositing a hardmask and a photoresist pattern;
    etching the bottom electrode layer to form a bottom electrode having a non-planar portion with an apex, the etching the bottom electrode layer to form the bottom electrode comprising an anisotropic etch process and an isotropic etch process;
    depositing a resistive material layer, a capping layer, and a top electrode layer over the bottom electrode;
    forming a top electrode by patterning and etching the top electrode layer, the capping layer and the resistive material layer; and
    depositing a second RRAM stop layer and a dielectric layer.

2. The method of claim 1, further comprising patterning and filling a bit line via through the RRAM stop layer and the dielectric layer to the top electrode for a column of RRAM cells.

3. The method of claim 1, further comprising patterning and filling a top electrode via for each RRAM cell.

4. The method of claim 1, wherein the bottom electrode also has a planar portion below the non-planar portion and above a via portion.

5. The method of claim 1, further comprising forming four metal interconnect layers between the transistor and the RRAM structure.

6. The method of claim 1, wherein the top electrode layer is tantalum nitride, titanium nitride, or platinum.

7. The method of claim 1, wherein the RRAM cell array is formed using two photomasks in addition to photomasks used for logic devices.

8. The method of claim 1, wherein the etching the bottom electrode layer to form the bottom electrode further comprises:
    performing a first anisotropic etch to pattern the hardmask and the bottom electrode layer using the photoresist pattern as a mask; and
    performing a ladder etch of the patterned hardmask and the patterned bottom electrode layer to form the bottom electrode having the non-planar portion with the apex.

9. The method of claim 8, wherein the performing the ladder etch of the patterned hardmask and the patterned bottom electrode layer further comprises:
    (a) isotropically etching the patterned hardmask to reduce the size of the patterned hardmask, the isotropically etching generating polymers to protect sidewalls of the patterned bottom electrode layer;
    (b) anisotropically etching the patterned bottom electrode layer using the reduced size patterned hardmask; and
    (c) repeating steps (a) and (b) until the patterned hardmask is consumed.

10. A method comprising:
    forming a first stop layer over a RRAM portion of a substrate and a logic portion of the substrate;
    patterning the first stop layer to form an opening through the first stop layer, the opening being in the RRAM portion of the substrate;
    filling the opening in the first stop layer with a conductive material, the conductive material extending over an upper surface of the first stop layer in the RRAM portion and the logic portion of the substrate;
    patterning the conductive material to remove the conductive material from the logic portion of the substrate and to form a bottom electrode of a RRAM cell, the bottom electrode having a via portion and a non-planar portion, the via portion of the bottom electrode being embedded in the opening of the first stop layer, the non-planar portion having an apex and being centered above the via portion;
    conformally forming a resistive material layer over the non-planar portion of the bottom electrode;
    forming a top electrode layer over the resistive material layer; and
    patterning the resistive material layer and the top electrode layer to remove them from the logic portion of the substrate and to form a top electrode over the resistive material layer and the bottom electrode in the RRAM portion of the substrate.

11. The method of claim 10, wherein the bottom electrode further comprises a planar portion of the bottom electrode between the non-planar portion and the via portion, the planar portion of the bottom electrode extending along an upper surface of the first stop layer.

12. The method of claim 10 further comprising:
    forming a first via to the top electrode; and
    forming a second via to a conductive feature in the logic portion of the substrate, the forming the first via and the forming the second via being performed by a same process.

13. The method of claim 10, wherein the non-planar portion of the bottom electrode has a height and a base width in a cross section, and wherein a ratio of the height over the base width is greater than about 1.

14. The method of claim 10, wherein a cross section of the non-planar portion of the bottom electrode is a half-ellipse, a parabola, or a catenary.

15. The method of claim 10, wherein the patterning the conductive material to form a bottom electrode of the RRAM cell comprises an anisotropic etch process and an isotropic etch process.

16. A method of forming a resistive random access memory (RRAM) device, the method comprising:
    forming a first RRAM cell, wherein the forming the first RRAM cell comprises:
        forming a first stop layer over a substrate;
        forming a bottom electrode comprising a first portion, a second portion, and a third portion, the first portion being embedded in the first stop layer, a second portion extending along a top surface of the first stop layer, and a third portion having a non-planar top surface and extending from the second portion, the non-planar top surface having an apex above the second portion, the second portion being between the first portion and the third portion;

conformally forming a resistive material layer over the third portion of the bottom electrode and at least some of the second portion of the bottom electrode; and forming a top electrode over the resistive material layer.

17. The method of claim 16 further comprising forming a second RRAM cell adjacent the first RRAM cell, the second portion of the bottom electrode of the first RRAM cell extending to a bottom electrode of the second RRAM cell.

18. The method of claim 16, wherein the third portion of the bottom electrode of the first RRAM cell has a height and a base width in a cross section, and wherein a ratio of the height over the base width is greater than about 1.

19. The method of claim 16, wherein a cross section of the third portion of the bottom electrode of the first RRAM cell is a half-ellipse, a parabola, a triangle, or a catenary.

20. The method of claim 16, wherein the forming the first RRAM cell further comprises forming a capping layer over the resistive material layer, the top electrode being over the capping layer.

* * * * *